(12) United States Patent
Diemer et al.

(10) Patent No.: US 8,487,252 B2
(45) Date of Patent: Jul. 16, 2013

(54) PARTICLE BEAM MICROSCOPE AND METHOD FOR OPERATING THE PARTICLE BEAM MICROSCOPE

(75) Inventors: Simon Diemer, Roettingen (DE); Hubert Mantz, Neu-Ulm (DE); Jaroslaw Paluszynski, Oberkochen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 123 days.

(21) Appl. No.: 13/249,006

(22) Filed: Sep. 29, 2011

(65) Prior Publication Data

US 2012/0074317 A1 Mar. 29, 2012

Related U.S. Application Data

(63) Continuation-in-part of application No. 13/029,998, filed on Feb. 17, 2011, now Pat. No. 8,227,752.

(30) Foreign Application Priority Data

Sep. 29, 2010 (DE) .......................... 10 2010 046 902
Jun. 10, 2011 (DE) .......................... 10 2011 103 997

(51) Int. Cl.
*H01J 37/26* (2006.01)
*H01J 37/10* (2006.01)
*G01N 23/00* (2006.01)

(52) U.S. Cl.
USPC ........... 250/311; 250/310; 250/306; 250/307; 250/396 R; 250/398

(58) Field of Classification Search
USPC .............. 250/311, 310, 306, 307, 396 R, 398
See application file for complete search history.

(56) References Cited

U.S. PATENT DOCUMENTS

| 5,548,694 A | 8/1996 | Frisken-Gibson |
| 6,407,373 B1 * | 6/2002 | Dotan .......................... 250/201.3 |

(Continued)

FOREIGN PATENT DOCUMENTS

| DE | 10 2005 026 022 A1 | 12/2006 |
| EP | 1 061 358 A | 12/2000 |

(Continued)

OTHER PUBLICATIONS

Q. Pan et al., "Interactive Model Reconstruction with User Guidance", University of Cambridge, Proceeding ISMAR '09 Proceedings of the 2009 8th IEEE International Symposium on Mixed and Augmented Reality, 4 pp.

(Continued)

*Primary Examiner* — Nikita Wells
(74) *Attorney, Agent, or Firm* — Bruce D Riter

(57) ABSTRACT

A method for operating a particle beam microscope comprising detecting light rays or particles which emanate from a structure, wherein the structure comprises at least one of: at least a portion of a surface of an object and at least a portion of a surface of an object holder of the particle beam microscope; generating a surface model of the structure depending on the at least one of the detected light rays and the particles; determining a position and an orientation of the surface model of the structure relative to the object region; determining a measurement location relative to the surface model of the structure; and positioning the object depending on the generated surface model of the structure, depending on the determined position and orientation of the surface model of the structure, and depending on the determined measurement location.

26 Claims, 12 Drawing Sheets

U.S. PATENT DOCUMENTS

| | | | |
|---|---|---|---|
| 6,538,249 | B1 | 3/2003 | Takane et al. |
| 6,943,349 | B2 * | 9/2005 | Adamec et al. ............... 850/9 |
| 7,642,514 | B2 | 1/2010 | Takane et al. |
| 7,745,804 | B1 | 6/2010 | Wan |
| 7,904,845 | B2 | 3/2011 | Fouquet et al. |
| 8,368,020 | B2 * | 2/2013 | Mantz et al. ............... 250/310 |
| 2008/0315120 | A1 | 12/2008 | Albiez |
| 2009/0101817 | A1 * | 4/2009 | Ohshima et al. ............... 250/310 |
| 2011/0031215 | A1 * | 2/2011 | Mantz et al. ............... 216/60 |

FOREIGN PATENT DOCUMENTS

| | | |
|---|---|---|
| JP | 2008-112596 A | 5/2008 |
| WO | 2007/090537 A2 | 8/2007 |

OTHER PUBLICATIONS

Q. Pan et al., "Interactive Model Reconstruction with User Guidance", University of Cambridge, Poster, 2009 (http://mi.eng.cam.ac.uk/~qp202/my_papers/ISMAR09/ISMAR09poster.pdf), 1 p.

Q. Pan, "Real-time Interactive 3D Modelling", Machine Intelligence Labs, University of Cambridge, 26 pp.

D. Henrich, "Schnelle Kollisionserkennung durch parallele Abstandsberechnung", 13. Fachgespräch Autonome Mobile Systeme (AMS '97), Stuttgart, 6. + 7. Oktober 1997, Springer-Verlag, Reihe "Informatik Aktuell", pp. 1-12 (with English-language "Statement of Relevance" 1p.).

P. Lindemann, "The Gilbert-Johnson-Keerthi Distance Algorithm", Media Informatics Proseminar, Algorithms in Media Informatics, 2009, pp. 1-4.

G. Zachmann, "Virtual Reality in Assembly Simulation—Collision Detection, Simulation Algorithms, and Interaction Techniques", Dissertation, Universitat Darmstadt, Fraunhofer IRB Verlag, 2001, 231 pp.

T. Moons et al., "3D Reconstruction from Multiple Images: Part 1 Principles", Foundations and Trends in Computer Graphics and Vision, Band 4, 4. Ausgabe, 2009, pp. 287-404.

G. Frankowski et al., "DLP-Based 3D Metrology by Structured Light or Projected Fringe Technology for Life Sciences and Industrial Metrology", Proceedings of SPIE, Photonics West, 2009, pp. 1-12.

Q. Pan et al., "ProFORMA: Probabilistic Feature-based On-line Rapid Model Acquisition", Proceedings "BMVC 2009", British Machine Vision Association, London, 2009 (http://www.bmva.org/bmvc/2009/index.htm), 11 pp.

C. Erikson, "The Gilbert-Johnson-Keerthi (GJK) Algorithm", Sony Computer Entertainment America, 2005 (http://www.google.de/url?sa=t&rct=j&q=Christer+Ericson+Algorithm&source=web&cd=1&ved=0CCgQFjAA&url=http%3A%2F%2Frealtimecollisiondetection.net%2Fpubs%2FSIGGRAPH04_Ericson_the_GJK_algorithm.ppt&ei=InwmT7rTKYuAwb02I3YCA&usg=AFQjCNEOPITYYSC9UCmQwcFPtS8nXWxK2g), 18 pp.

K. Henriksen, "Collision Detection: The GJK Algorithm", Department of Computer Science, University of Copenhagen (http://www.google.de/url?sa=t&rct=j&q=Knud+Henriksen+algorithm&source=web&cd=2&ved=0CDMQFjAB&url=http%3A%2F%2F140.129.20.249%2F~jmchen%2Fcompg%2Fslides%2FGJK.pdf&ei=rX0mT8q5LM_sgaqpoTnCA&usg=AFQjCNEzC1C48nEZX1ScWrgvD_uwgEsTcw), 44 pp.

C. Teutsch, "Model-based Analysis and Evaluation of Point Sets from Optical 3D Laser Scanners", Otto-von-Guericke-Universität (Magdeburg), Shaker Verlag, Herzogenrath, 2007, 153 pp.

A. Cvetanovic et al., "Design of a novel visual and control system for the prevention of the collision during the micro handling in a SEM chamber", Microelectronic Engineering, vol. 87, 2010, pp. 139-143.

F. Schmoeckel et al., "Smart Flexible Microrobots for Scanning Electron Microscope (SEM) Applications", Journal of intelligent material systems and structures, vol. 11, 2000, pp. 191-200.

X. Yang et al., "Surface digitization technology based on multi-sensor integration", Proc. of the 5th International Conference on Responsive Manufacturing—Green Manufacturing ICRM, 2010, pp. 57-62.

A. Weckenmann et al., "Multisensor data fusion in dimensional metrology", CIRP Annals—Manufacturing Technology, vol. 58, 2009, pp. 701-721.

Office action in German patent application No. 10 2010 046 902.5 dated Jun. 9, 2011, 6 pp. (with English translation, 5 pp.).

Office action in German patent application No. 10 2010 046 902.5 dated Nov. 9, 2011, 6 pp. (with English translation, 7 pp.).

Search report dated Jan. 25, 2012 in parallel United Kingdom patent application No. GB1116720.2.

* cited by examiner

PARTICLE BEAM MICROSCOPE AND METHOD FOR OPERATING THE PARTICLE BEAM MICROSCOPE

CROSS-REFERENCES TO RELATED APPLICATIONS

The present application claims priority of German Patent Application No. 10 2010 046 902.5, filed Sep. 29, 2010 in Germany, entitled "Partikeistrahlmikroskop and Verfahren zum Betreiben hierzu", and of German Patent Application No. 10 2011 103 997.3, filed. Jun. 10, 2011 in Germany, entitled "Partikelstrahlmikroskop und Verfahren sum Betreiben hierzu", and of U.S. patent application Ser. No. 13/029,998, entitled "Method of Operating a Scanning Electron Microscope": the contents of these documents are hereby incorporated by reference in their entirety.

TECHNICAL FIELD

The present invention relates to a particle beam microscope and a method for operating a particle beam microscope. More specifically, the present invention relates to an electron microscope, such as a scanning electron microscope and a method for operating a scanning electron microscope.

BACKGROUND

When samples are imaged or processed with a particle beam microscope, such as an electron microscope, they are usually kept in a vacuum environment in the specimen chamber. The specimen chamber is evacuated by a vacuum pump. Typically, measurements with scanning electron microscopes are conducted at a vacuum level in the specimen chamber in a range of about high vacuum and about 22.5 Torr. The specimen chamber is therefore designed as a vacuum vessel, having solid walls and flanges, such that the leaking rates of atmospheric leaks can be kept as low as possible. Hence, the vacuum vessel usually does not have windows, which are large enough to allow a user to control the positioning of the object in front of the objective lens by visual observation.

Typically, the positioning of the sample is monitored by a COD-camera, which is arranged within the specimen chamber. The camera acquires a video image from the sample and the objective lens, which is displayed on a display. By looking at the video image, the user can observe the positioning process in real time and control the positioning of the sample via control signals, which are transmitted to a positioning device.

However, the displayed video image provides the user only with a two dimensional image from the interior of the specimen chamber, such that it is complicated to accurately position the object relative to the object lens. Furthermore, the viewing angle of the COD-camera for observing the object surface is typically obstructed by the objective lens and detectors, especially when the object is located close to the objective lens. Hence, the user quite often is not able to determine, which part of the sample is irradiated by the electron beam.

Beside the objective lens, there are typically also further components arranged in the interior of the specimen chamber, which may obstruct the view to the sample during a positioning process. Examples of such components are detectors, gas injection systems and manipulators. These components may also collide with the sample during a positioning process.

Conducting the positioning is even more complicated when a number of objects, in particular objects having a complex geometry, are attached to the object holder for being positioned in front of the objective lens.

By an inaccurately conducting the positioning process, it is possible that collisions occur, which may result in damages to either the object or to components of the electron microscope.

It has been recognized, that the positioning of a sample inside of a particle beam microscope is complicated to conduct. Thereby, handling the particle beam microscope for carrying out a positioning process within, a reasonable amount of time requires a lot of experience.

SUMMARY

Embodiments provide a method for operating a particle beam microscope, which comprises an objective lens having an object region, wherein the method comprises: detecting light rays and/or particles, which emanate from a structure, wherein the structure comprises at least a portion of a surface of an object and/or at least a portion of a surface of an object holder of the particle beam microscope; generating a surface model of the structure depending on the detected light rays and/or particles; determining a position and an orientation of the surface model of the structure relative to the object region; determining a measurement location relative to the surface model of the structure; and positioning the object depending on the generated surface model of the structure, depending on the determined position and orientation of the surface model of the structure, and depending on the determined measurement location.

Accordingly, a method for operating a particle beam microscope is provided, which allows to position a sample relative to a component of a particle beam microscope, in particular an objective lens, with a high accuracy. In particular, it is possible to position a location on the object surface, at which a measurement is to be taken, in an object region of the objective lens with high accuracy and within a short time. Thereby, it is possible, even for an inexperienced user, to conduct a measurement within a short time.

By way of example, the particle beam microscope may be a scanning electron microscope. Further examples of a particle beam microscopes are a focused ion beam systems, in particular helium ion microscopes.

The generating of the surface model of the structure is performed depending on the detected light, rays and/or particles. The surface model may be generated depending exclusively on the detected light rays. In other words, the surface model is generated exclusively from the information, which is obtained by the detected light rays.

However, it is also conceivable that additional information is used for generating the surface model. For example, the generating of the surface model may be performed depending on values, which are obtained by measurements, which are carried out in addition to a detecting of the light rays and/or particles. Thereby, it is possible to increase the speed for generating the surface model. A surface model may for example be determined depending on a measurement conducted by a coordinate measuring device. Furthermore, a surface model of at least a portion of the structure, in particular of at least a portion of the surface of the object holder, may be generated based on a CAD drawing.

The detecting of the light rays may be carried out with a light-sensitive sensor, in particular a semiconductor sensor. The generating of the surface model may be carried out by a computer. The positioning of the object may comprise an automatic positioning, which is controlled by the computer.

Furthermore, the detecting of the light rays may be performed by a light sensitive image capturing device. The image capturing device may comprise an image sensor, such as a CCD image sensor. A light sensitive image capturing device may for example comprise a camera, in particular a CCD-camera. The light sensitive image capturing device may be configured and arranged such that a digital image is acquirable, wherein the digital image represents or shows at least a portion of the structure. Furthermore, it is conceivable that the detected light rays are laser beams, which are scattered or reflected at the structure. The laser beams may be generated by a laser scanner which scans the structure. Based on the detected laser beams, at least one of the following may be performed: a time-of-flight measurement by timing the round-trip time of a pulse of light, phase comparison and/or triangulation. The image sensor of the light sensitive image capturing device may for example comprise a CCD-image sensor and/or a photodiode.

The light rays may have, wavelengths within a range from 400 nanometers to 700 nanometers. The light rays may be emitted from a light source and may be scattered or reflected at the structure. By way of example, in the specimen chamber of the particle beam microscope, a light source may be arranged, which illuminates the interior of the specimen chamber. The light rays may be light rays of a laser beam, which is emitted by a laser scanner, wherein the laser scanner is configured such that it scans the surface of the structure with the laser beam. Alternatively additionally, it is also conceivable that the light rays are emitted from light sources which are arranged at the structure. Such light, sources may for example be light-emitting diodes (LEDs).

The detecting of the light rays may be performed when the object and/or object holder is in the specimen chamber. Alternatively or additionally, the detecting of the light rays may be performed when the object and/or object holder is outside of the specimen chamber. For example, the detecting of the light rays may be performed in a load-lock chamber of the particle beam microscope. The load-lock chamber may be configured such that objects are first loaded into the load-lock chamber. After an evacuation of the load lock chamber, the objects are transferred into the specimen chamber. Thereby, the specimen chamber does not have to be ventilated for inserting new specimens. Thereby, the time in which the load-lock chamber is evacuated may be used to detect the light rays and to generate the surface model. It is also conceivable that the detecting of the light rays is performed outside of the vacuum system, which comprises the load-lock, chamber and the specimen chamber. For example, the detecting of the light rays may be performed under atmospheric pressure.

The detected particles may be charged particles. The particles may be electrons. The electrons may be secondary electrons and/or back scattered electrons. Furthermore, the particles may be ions, such as helium ions or secondary ions.

The particles emanate from the structure. The particles may be emitted from a portion of object, which is irradiated by the primary beam of the particle bean microscope. In other words, the particles may be emitted from an impingement location or an impingement region of the primary beam. The primary beam may be a scannable primary beam.

The detecting of the particles may be performed by one or more particle detectors. The particle detectors are configured such that particles are detected, which are emitted from an impingement location of the particle beam.

The object region may be defined as a spatial region relative to the particle beam microscope, wherein the particle beam microscope is configured such that an image is acquirable from a portion of an object, which is arranged in this spatial region. In other words, the object region may represent a spatial region, which is scannable by the primary beam of the particle beam microscope.

By way of example, the object is a wafer or a work piece. The scanning electron microscope may be used to acquire an image of a surface of the wafer or the work piece.

The structure may be a surface. The surface may be three-dimensional. The structure may be a surface, which comprises at least a portion of the surface of the object and/or at least a portion of the surface of the object holder. The structure may consist of a surface, which is movable relative to the object region by the positioning device. It is further conceivable that structure comprises at least a portion of a surface of a further component of the particle beam microscope. It is further conceivable that the structure does not comprise the total or the total exposed surface of the object. The structure does not have to comprise a surface of the object. For example, in case of objects being relatively small compared to a size of the object holder, it might be sufficient, that the structure comprises a portion of the surface of the object holder without any portion of the surface of the object. The object holder may be defined as a component of the particle beam microscope, which is configured to retain an object on which measurements are to be taken. By way of example, the object holder may comprise a surface, at which the object is attached. The object, may be attached to the object holder by adhesive and/or by screws of the object holder. The object may be attached to the object holder and the object holder may be attached to the positioning device. The object holder may be configured to provide a mechanical connection between the object and the positioning device. In other words, the object and the object holder may be positioned simultaneously within the particle beam microscope by the positioning device.

The surface model may be a model, which represents the form or shape of the structure. In other words, the surface model of the structure may be a mathematical representation of the structure. For example, a maximum distance of the surface model from the structure may be less than 10 millimeters or less than 1 millimeter or less than 0 millimeter or less than 10 micrometers or less than 1 micrometer or less than 100 nanometers or less than 10 nanometers. The distances may be measured along a surface normal of the surface model, wherein the surface model is positioned relative to the structure such that the sum or integral of the squared distances yield a minimum.

Hence, the surface model may represent the structure to a predetermined accuracy. The accuracy of the surface model may be chosen such that a positioning of the structure in relative to the objective lens may be carried out with a predetermined positioning accuracy. For example positioning accuracy may be lower than 100 nanometers, lower than 1 micrometer, lower than 10 micrometers, lower than 0.1 millimeter, lower than 0.5 millimeter, lower than 1 millimeter or lower than 5 millimeters.

The surface model may represent a flat two-dimensional structure. For example, the surface model of a wafer may be a circular disc, wherein the edge of the circular disc represents the outer edge of the wafer. The surface model may be a three-dimensional surface model. A three-dimensional surface model may be defined such that it comprises an uneven surface. By way of example, a three dimensional surface model may represent a lateral surface and a top surface of a cylinder or a cuboid (i.e. without its base).

By way of example, the surface model may comprise or consist of a plurality of points. In other words, the surface model may comprise or may consist of a point cloud. The number of points may, for example, be more than 10, more than 100, more than 1,000 or more than 10,000. Furthermore, the number of points may, for example, be less than $10^{10}$ points or less than $10^9$ points. Each of the points may be defined by three coordinate values, which represent a position of the points in space relative to a coordinate system.

At least a portion of the points may be connected by geometric objects like line segments, polygons, plane segments arcuate surface segments and/or arcuate line segments. The plane segments may comprise triangular and/or trapezoidal plane segments. For each point, the distances between the point and its closest neighboring point may, be less than 5 millimeters or less than 1 millimeter or less than 0.1 millimeter or less than 10 micrometers or less than 1 micrometer or less than 100 nanometers or less than 10 nanometers.

Additionally or alternatively, the surface model may at least partly be based on splines. In other words, the surface model may be based on a set of polynomial surface functions, wherein a polynomial surface function describes at least a portion of the surface model. A plurality of polynomial surface functions of a degree less or equal to four may be sufficient for achieving a predetermined accuracy of the surface model.

The surface model may further comprise marks, wherein the marks correspond to marks on the structure. For example, the structure may comprise marks, which are detectable by the detecting of the light rays and/or particles. Such marks may, for example, be color coded marks or portions on the structure, which have a reflectivity, which is different from a reflectivity of portions of the structure, which surround the marks.

The objective lens may, be an electron beam objective lens or an objective lens for focused ion beams. Furthermore, also other components of the particle beam microscope may comprise object regions, such as a particle detector or a component for object preparation. Examples for particle detectors are secondary electron detectors (also denoted as SE-detectors), energy dispersive detectors for X-rays (also denoted as EDX detectors) and electron back scattered electron detectors (also denoted as EBSD detectors). Examples for components for object preparation are gas injection systems, focused ion beam systems (FIB) and micromanipulators.

Furthermore, the position and orientation of the surface model relative to the object region is determined. The determining of the position and orientation of the surface model may comprise interpolating of points of the surface model.

A rigid body comprises six degrees of freedom of movement. The six degrees of freedom of movement are, for example, expressed by three coordinate values of translation and three rotation angle values. Under translation, all points of the rigid body move by the same translation vector. The three coordinate values of translation together define the position of the rigid body. Under rotation, all points of the rigid body are rotated by an angle about a rotation axis. The three rotation angles define the orientation of the rigid body. The orientation of the surface model may be expressed by yaw, pitch and roll or by Euherian angles.

The determining of the position and orientation of the surface model relative to the object region may be performed such that the position and orientation of the surface model is aligned to a position and orientation of the structure relative to the object region.

The determining of the position and orientation of the surface model of the structure may be performed depending on the surface model of the structure. For example, an extent of the structure and/or distances between marks of the structure may be known from the determined surface model of the structure. Furthermore, the determining of the position and orientation of the surface model relative to the object region may be performed depending on the detected light rays. In particular, the position and orientation may be determined depending on a digital image of a light sensitive image capturing device, wherein the digital image depicts at least a portion of the structure. Additionally or alternatively, the determining of the position and orientation may be performed depending on the signals, which are transmitted between the computer and the positioning device. For example, the positioning device may comprise a measuring unit, which is configured to measure the position and/or orientation of the structure. Additionally or alternatively, the position and/or orientation of the structure may be determined depending on control, signals, which are transmitted from a controller to the positioning device. The controller may, for example, be a computer. Additionally or alternatively, the determining of the position and the orientation of the surface model of the structure may be performed depending on detected particles, which emanate from the structure. Particle detectors may detect the particles at different focus distances of the primary beam. Additionally or alternatively, determining of the position and orientation of the surface model of the structure may be performed depending on particle microscopic images, which depict at least a portion of the structure.

The positioning of the structure may be performed by a positioning device of the particle beam microscope. The positioning device may comprise one or more actuators. The object holder may be arranged at the positioning device. Thereby, the positioning device may be configured such that by controlling one or more actuators, the object is positionable in the particle beam microscope relative to the objective lens, relative to a detector and/or relative to a component for object preparation. The positioning may, in particular, comprise a positioning of the measurement location in the object region of the objective lens. Furthermore, the positioning may also comprise an adjusting of a measurement orientation. The measurement orientation may be defined as an orientation of the object, at which a measurement is carried out. A measurement orientation, for example, may be defined by three angles of rotation.

The measurement location may represent a portion on the surface of the object, at which a measurement is to be taken or at which particle microscopic image is to be acquired. The measurement location may be located outside of the surface model of the structure. The determining of the measurement location relative to the surface model may be performed depending on a user input via the computer. For example, the user may select, a portion of the surface model in which he wants to perform a measurement or acquire an image, based on a two dimensional representation of the surface model on a display of the computer. Depending on the user input, the computer may determine or calculate a measurement location relative to the surface model.

The positioning is performed depending on the determined surface model. The positioning may comprise interpolating points of the surface model of the structure. Depending on the surface model and the measurement location relative to the surface model, a positioning direction may be determined for arranging the measurement location in the object region. Furthermore, based on the surface model, the user or the computer may determine in which measurement orientation the measurement is to be taken or the image is to be acquired. The positioning of the object may be controlled by the computer. However, it is also conceivable that the user manually controls the positioning of the object, wherein for example the surface model of the structure, the position and orientation of the surface model of the structure and the measurement location is displayed on a display of the computer. Depending on the user input, the computer positions the object.

According to a further embodiment, the positioning of the object further comprises a determining of a positioning path. The positioning path may be determined by a computer depending on the surface model, on the determined position and orientation of the surface model relative to the object region, the measurement location and/or the measurement orientation. The positioning path may be determined such that the measurement location is located in the object region. Furthermore, the positioning path may be determined such that the positioning is carried out without collision.

According to an embodiment, the positioning of the object comprises arranging the measurement location in the object region.

According to a further embodiment, the method further comprises adjusting of a focus of the objective lens after having arranged the measurement location in the object region.

By arranging the measurement location in the object region according to the method, the position and orientation of the structure relative to the objective lens is known to a comparatively higher accuracy The focus of the scanning electron microscope is typically adjusted with an accuracy, which is in a range between a few nanometers (nm) to a few micrometers (μm), depending on the set magnification of the scanning electron microscope. The adjusting of the focus may be performed automatically by setting operation parameters of the particle beam optical system depending on acquired particle microscopic images. As a result of the determining of the position and orientation of the structure with high accuracy, an automatic adjustment of the focus is alleviated. Thereby, in particular, an adjusting of the focus may be performed within a short time.

According to an embodiment, the method further comprises: generating a surface model of a microscope portion of the particle beam microscope; combining the surface model of the structure and the surface model of the microscope portion to generate a combined surface model; and calculating a distance between the surface model of the structure and the surface model of the microscope portion depending on the combined surface model; wherein the positioning of the object comprises monitoring the distance.

Accordingly, it is possible to quickly move the object within the particle beam microscope without risking collisions, which may damage the object or the particle beam microscope. In particular, a secure positioning is enabled for objects having a complex geometry or for a plurality of objects which are together mounted on the object holder.

The microscope portion may be at least a portion of a surface of a component of the particle beam microscope. Examples for such a component are: the specimen chamber, a detector, a manipulator, a as supply and/or an objective lens.

The combined surface model may be defined as a surface model, in which the surface model of the structure and the surface model of the microscope portion are arranged relative to each other corresponding to the relative arrangement of the structure and the microscope portion in the specimen chamber. The combining of the surface models may be performed by the computer. The surface model of the microscope portions may comprise points and/or geometric objects, such as has been described with respect to the surface model of the structure.

The combining to generate the combined surface model may comprise: determining a position and an orientation of the surface model of the structure relative to the surface model of the microscope portion.

The determining of the position and orientation of the surface model of the structure relative to the surface model of the microscope portion may comprise acquiring a digital image, which represents or shows at least a portion of the structure, wherein the digital image is acquired from a viewpoint position relative to the microscope portion. The digital image may be generated by a light sensitive image capturing device, and/or the digital image may be a particle microscopic image. Additionally, the digital image may show at least a portion of the microscope portion.

The acquired digital image may then be compared with the surface model of the structure. Depending on the comparing, a position and orientation of the surface model of the structure relative to the surface model of the microscope portion may be determined. The comparing may comprise segmenting of the digital image. The segmenting may comprise one or a combination of the following methods: a pixel-oriented method, an edge-oriented method, a region-oriented method, a model-based method, a texture-based method and/or a color-oriented, method. In particular, the comparing may comprise a model-based segmentation method depending on the surface model of the structure.

Additionally or alternatively, the method may comprise extracting features from the digital image, wherein the extracted features correspond to features of the surface model of the structure. Examples of such features are: edges, surface topography, and/or detectable marks. The comparing may comprise applying a routine for edge detection, for frequency filtering and/or for pattern recognition. Furthermore, the comparing may comprise interpolating points of the surface model.

Additionally or alternatively, the combining to a combined surface model may be performed depending on signals, which are transmitted between the computer and the positioning device. For example, the positioning device may comprise a measuring unit, which is configured to determine the position and orientation of the structure relative to the microscope portion. Furthermore, the position and/or orientation of the surface model of the structure relative to the surface model of the microscope portion may be determined depending on control signals, which are transmitted from a controller to the positioning device. The controller may, for example, be the computer. Alternatively or additionally, the combining to the combined surface model may be performed depending on detected particles, which emanate from the structure. Particle detectors may detect particles at different focus distances of the primary beam. Alternatively or additionally, the determining of the position and orientation of the surface model of the structure relative to the surface model of the microscope portion may be performed depending on particle microscopic images, which represent or show at least a portion of the structure.

Depending on such a combined surface model, a distance between the structure and the microscope portion is determinable. The detecting of an imminent collision between the microscope portion and the structure may be performed depending on the determined distance.

According to an embodiment, the method comprises determining of a positioning path depending on the combined surface model. The positioning path may be calculated by the computer.

The distance may represent a minimum distance between the structure and the microscope portion. The minimum distance between two bodies may be determined by determining a smallest distance between any two points of the two bodies, wherein the line between the two points connects the two bodies.

For example, the determining of the distance may comprise comparing distances between pairs of points, wherein each pair comprises a point of the surface model of the microscope portion and a point of the surface model of the structure. Depending on the comparing, a pair of points may be determined, which has a smallest distance of all pairs of points. The distance may be calculated by the computer. Furthermore, the determining of the distance may comprise interpolating points of the surface model of the structure and/or interpolating points of the surface model of the microscope portion.

The determining of a distance may comprise determining or calculating distances between pairs of points, wherein each of the pair of points comprises a point of the structure and a point of the microscope portion; and determining a pair of points, which has the smallest distance among all pairs of points.

Algorithms for determining collisions on the basis of surface models are disclosed in the Ph.D thesis "Virtual Reality in Assembly Simulation—Collision Detection, Simulation Algorithms and Interaction Techniques" of Gabriel Zachmann (Technische Universitaet Darmstadt), published by Fraunhofer IPE Verlag; the contents of which are incorporated herein in its entirety. Furthermore, algorithms for collision detection are disclosed in the article "Schnelle Kollisionserkennung durch paraliele Abstandsberechnung" of Dominik Henrich, et al., published in 13. Fachgespraech Autonome Mobile Systeme (AMS '97), Stuttgart, Oct. 6 and 7, 1997, published by Springer Verlag, series "Informatik Aktuell"; the contents of which are incorporated herein in its entirety.

The monitoring of the distance may comprise issuing a notification or a warning signal by the particle beam microscope system, when the distance has fallen, below a predetermined or predeterminable permissible distance. Alternatively or additionally, it is conceivable that the positioning of the object holder by the positioning device is automatically stopped when the distance is smaller than the permissible distance.

The permissible distance may be predetermined. The permissible distance may be determined such that a collision between a structure and the microscope portion is prevented. Furthermore, the permissible distance may be determined taking into account an accuracy with which the structure and the microscope portion are approximated by the combined surface model.

According to a further embodiment, the positioning of the object comprises determining of a positioning path depending on the combined surface model. The determining of the positioning path may comprise a determining of distances between the surface model of the structure and the surface model of the microscope portion along the positioning path. The positioning of the object may be performed depending on the determined positioning path.

By automatically determining the positioning path by the computer, a fast and automatic positioning may be performed without collision. However, it is also conceivable that a user may perform a manual positioning, wherein positioning movements which may lead to a collision are prevented by notifications, warning signals, and/or a stopping of the positioning process.

According to a further embodiment, the determining of the position and orientation of the surface model of the structure relative to the object region comprises: generating a digital image, from at least a portion of the structure; and comparing the surface model of the structure with the digital image.

The digital image may be acquired with a light-sensitive image capturing device. Alternatively or additionally, the digital image may be acquired by scanning a portion of the structure with a primary beam of the particle beam microscope. The digital image may be a particle microscopic image.

The comparing may comprise identifying features of the digital image, wherein the features of the digital image correspond to features of the surface model of the structure or features of the combined surface model. In other words, the comparing may comprise identifying features of the surface model, which are represented or shown in the digital image. Such features may, for example, comprise edges, marks and/or surface topography of the structure and/or microscope portions. The comparing may comprise applying a routine for edge detection, for frequency filtering and/or for pattern recognition. Furthermore, the comparing may comprise interpolating points of the surface model. The comparing may comprise segmenting the digital image. The segmenting may comprise one or a combination of the following methods: a pixel oriented method, an edge-oriented method, a region-oriented method, a model-based method, a texture-based method. In particular, the comparing may comprise a model-based method for segmentation depending on the surface model of the structure.

The digital image may be compared with a two-dimensional representation of the surface model of the structure. The two-dimensional representation may be generated by projecting the surface model at a given position and orientation onto a plane. The two-dimensional representation may be compared with the digital image to decide whether the given position and orientation corresponds to the position and orientation of the structure.

According to a further embodiment, the determining of the position and orientation of the surface model of the structure relative to the object region is performed depending on the digital image, depending on the viewpoint position of the image capturing device and depending on the surface model of the structure.

According to a further embodiment, the method further comprises: determining a second measurement location relative to the surface model of the structure and relative to the measurement location; and repositioning the object depending on the measurement location and the second measurement location.

The repositioning may further be performed depending on the surface model of the structure. The measurement location relative, to the surface model of the structure may be stored, in particular in a storage device of the computer. The storing of the measurement location relative to the surface model may comprise a storing of coordinates of a point relative to the surface model. Alternatively or additionally, a measurement orientation relative to the surface model may be stored. The measurement orientation may be defined such that it represents the orientation of the structure when a measurement is taken.

The second measurement location may be the same measurement location as the stored measurement location. Thereby, it is possible to find again a location, at which a measurement has been taken.

Thereby, it is possible to readjust a measurement orientation and/or to find a measurement location again after the object has been moved by operating the positioning device. The object may have been moved, for example, to perform a preparation outside of the particle beam microscope. This allows to obtain measurements of exactly the same location and/or exactly the same orientation. Furthermore, it is possible to assign stored images, which have been acquired with the particle beam microscope to stored measurement locations and/or measurement orientations.

According to a further embodiment, the method further comprises: generating a particle microscopic image, which represents at least a portion of the measurement location; identifying a region of the particle microscopic image; and adjusting a position and/or an orientation of the object depending on the identified region.

The adjusting in dependence on the identified region of the particle microscopic image may be performed at an accuracy, which is higher than the accuracy for the positioning in dependence of the surface model of the structure. In other words, the positioning in dependence of the surface model of the structure may provide a coarse positioning, which is followed by a fine positioning, which is performed in dependence on the identified region of the particle microscopic image. In particular, it is possible to reproducibly find a measurement location again with an accuracy, which corresponds to the resolution of the particle microscopic image.

The identifying of the region of the particle microscopic image may comprise comparing the particle microscopic image with stored particle microscopic images. The stored particle microscopic images may have been acquired during a preceding positioning process. Thereby, it is possible to identify a portion of the object, where already a particle microscopic image has been acquired. Furthermore, the identifying of the region of the particle microscopic image may comprise a segmenting of the particle microscopic image, an edge detection and/or a frequency filtering of the particle microscopic image. Thereby, features may be determined in the particle microscopic image, which are to be examined by the particle be microscope. Based on the identified region of the particle microscopic image, it is possible to determine a positioning path for acquiring an image of the identified region at a higher magnification. The computer may be configured to perform the positioning depending on lee identified region.

According to an embodiment, the detecting of the at light rays and/or particles comprises detecting the light rays and/or particles at a plurality of different focus distances.

The focus distances may be focus distances of a light sensitive image capturing device and/or focus distances of the primary beam.

The focus distance of the primary beam may be a distance of a beam waist of the primary beam of the particle microscope from a reference point of the particle optical system of the particle beam microscope. The reference point may, for example, be a principal, plane of the objective lens or a component of the particle optical system of the particle beam microscope. The focus distance of the light sensitive image capturing device may be a focus distance of a light optical system of the light sensitive image capturing device, such as a lens assembly.

According to an embodiment, the generating of the surface model of the structure further comprises: generating a plurality of stacks of image regions depending on the detected light rays and/or the detected particles at the plurality of focus distances; wherein image regions, which are cart of a same stack of the plurality of stacks represent a same portion of the structure; determining for each stack of the plurality of stacks an in-focus region depending on the image regions of the respective stack.

Each of the image regions may be a group of pixels of the digital image. The digital image may be acquired at a focus distance of the light sensitive image capturing device and/or of the primary beam. Each of the image regions may be generated by selecting pixels from the digital image. All pixels of an image region may be generated at the same focus distance.

Image regions, which form part of a same stack, show a same portion of the structure. Image regions, which form part of a different stack may show different portions of the structure. The different portions of the structure may be adjacent. The adjacent portions may be non-overlapping. Alternatively, the different portions may partly overlap each other. Furthermore, the different portions may be spaced apart from each other.

The in-focus region is determined by determining the image region from all image regions of a stack, which has the highest resolution. The determining of the in-focus region may comprise comparing all image regions of a stack. The determining of the in-focus region may comprise determining frequencies, in particular spatial frequencies, of image data values for each image region of a stack. The frequencies may be frequencies of a row and/or a column of the image region. For example, the determining of a frequency may comprise determining a Fourier transform, in particular a discrete Fourier transform a of at least a portion of the image data of an image region. For example, the image region, which has a highest frequency in its power spectrum is the in-focus region. Furthermore, the in-focus region may be the image region having the greatest power values in the power spectrum at a predetermined frequency or within a predetermined frequency range. Additionally or alternatively, the determining of the in-focus region may comprise determining of differences and/or gradients of image data values of the image regions of the stack. For example, the image region having the highest absolute values of differences of neighboring image data values is determined, as the in-focus region. Additionally or alternatively, determining of the in-focus region may comprise applying an edge detection filter to each image region of a stack.

The determining of the in-focus region may be performed depending on pixel data values of the image regions of the respective stack. Alternatively or additionally, the determining of the in-focus region may be performed depending on pixels outside of the image region. For example, the determining of the in-focus region may be performed depending on pixels, which are adjacent to or spaced apart from the pixels of the image region of the respective stack. Thereby, it is in particular possible that an image region consists of a single pixel.

According to a further embodiment, each image region, of at least a portion of the generated image regions is an isolated pixel cluster.

A pixel cluster may be defined as a group of pixels, wherein each of the pixels is located adjacent (i.e. not spaced apart) to at least one other pixel of the pixel cluster. An isolated pixel cluster may be defined as a pixel cluster, wherein each pixel of the isolated, pixel cluster spaced apart from a pixel, of another image region of a different stack. In other words, the portion of the structure, which is represented or shown by the pixel cluster is neither adjacent nor overlapping, but spaced apart from portions of the structure, which are represented by other image regions which form part of a different stack.

Each of the isolated pixel clusters may consist of between 1 and 8 pixels, between 1 and 50 pixels or between 1 and 500 pixels, or between 1 and 1,000 pixels, or between 1 and 10,000 pixels. In particular, a pixel cluster may consist of an individual pixel.

A minimum distance between a first and a second pixel cluster may be defined as a smallest distance of all distances between pixels of the first pixel cluster and pixels of the second pixel cluster.

The minimum distance between pixel clusters of different stacks may be more than 10 times, more than 100 times or more than 1,000 times the diameter of the pixel. In other words, a distance between regions of the structure, which are represented by isolated pixel, clusters of different stacks may be many times more than a sampling distance between pixels of the image region. A sampling distance may be defined as a diameter of a portion of the structure, which is represented by a pixel.

The acquiring of the image data of the image region may comprise a scanning with the primary beam structure regions, which connect the isolated pixel clusters. The isolated pixel clusters may then be cut out from the acquired image. Thereby, it is possible, that only a small number of pixel data values have to be processed by the computer to generate the surface model of the structure.

Alternatively, the generating of the image regions may comprise skipping a scanning of structure portions, which connect the isolated pixel clusters. In other words, the structure portions, which connect the isolated pixel clusters are not scanned by the primary beam. This allows to generate a surface model having a comparatively large structure within a short time.

According to a further embodiment, the method further comprises: generating digital image data, which represent at least a portion of the structure depending on the detected light rays and/or the detected particles; wherein the generating of the surface model of the structure is performed depending on the digital image data.

The digital image data may be pixel data values of a group of pixels, in particular of a digital image. The pixel data values may represent color and/or gray scale values. The digital image data values may represent at least a portion of the structure. The digital image data may be acquired by a light-sensitive image acquisition device and/or by a scanning of the primary beam.

Based on the digital image data, the surface model may be calculated by a computer. Such algorithms are, for example, described in the article "3D Reconstruction from Multiple images: Part 1 Principles" of Theo Moons, Luc van. Cool, and Maarten Vergauwen, published in "Foundations and Trends in Computer Graphics and Vision", Volume 4, Issue 4, pages 287 to 404; the contents of which are incorporated herein in its entirety. Furthermore, such algorithms are described in the article "DLP-Based 3D Metrology by Structured Light or projected Fringe Technology for Life Sciences and Industrial Metrology" of G. Frahkowski and R. Hainch, published, in "Proceedings of SPIE Photonics West 2009"; the contents of which are incorporated herein in its entirety. Furthermore, such algorithms are described in the article "ProFORMA: Probabilistic Feature-based On-line Rapid Model Acquisition." of Qi Pan et al., published in the Proceedings of the "BMVC 2009" of the British Machine Vision Association, London (obtainable on the webpage http://www.bmva.org/bmvc/2009/index.htm), the contents of which are incorporated herein in its entirety.

Alternatively or additionally, it is conceivable that, for example, based on further measurements at the structure, a course model is available which is adapted depending on the digital image data. For example, a surface model of at least a portion of the surface of the object holder may be stored in the storage device. Depending on the digital image data, the stored surface model of the portion of the surface of the object holder is supplemented to yield a surface model of the structure.

Thereby, the surface model of the structure may be obtained from the digital image data within a short time.

The position and orientation of the surface model relative to the object region or relative to the surface model of the microscope portion may be determined depending on the digital image data. By way of example, a viewpoint position relative to the object region from which the digital image data are acquired, an imaging direction and/or a magnification of the digital image data may be known. Thereby, it is possible to determine the position and orientation of the surface model.

The acquiring of the digital image of the structure may be performed by a light-sensitive image capturing device, such as for example a camera.

According to a further embodiment, the generating of the surface model depending on the digital image data comprises a segmenting of the digital image data. The segmenting may further comprise one or a combination of the following segmenting methods: a pixel-oriented method, an edge-oriented method, a region-oriented method, a model-based method and a texture-oriented method. An example of a pixel-oriented method is the threshold method. Examples for edge-oriented methods are: applying the Sobel-Operator, applying the Laplace-Operator and/or gradient detection. Examples for a region-oriented method are: Region Growing, Region-Splitting, Pyramid Linking and Split and Merge. An example for a model-based method is the Hough-Transformation. Examples for a texture-based method are co-occurrence Matrices and Texture-Energy-Measure.

According to a further embodiment, the generating of the digital image data comprises generating the digital image data from at least two different imaging directions.

The image data, which have been acquired from the at least two different imaging directions may represent stereoscopic image data. For example or two or more images are acquired from different imaging directions relative to the structure. Depending on the stereoscopic image data, the surface model of the structure, the position and/or orientation of the surface model of the structure relative to the object region, and/or the position and orientation of the surface model of the structure relative to the surface model of the microscope portion may be determined.

The acquiring of the digital images from different imaging directions may, for example, comprise varying of the orientation and/or position of the structure relative to a light-sensitive image capturing device and/or relative to the primary beam. For example, the orientation and/or the position of the structure may be varied by the positioning device. Thereby, the structure may be imaged by the camera or the primary beam from different imaging directions. An imaging direction may be defined by a vector, which is parallel to the optical axis of the light-sensitive image capturing device or parallel to the optical axis of the particle optical system.

Additionally or alternatively, the imaging direction may be altered by varying an impingement direction of the primary beam relative to an optical axis of the particle beam microscope. Additionally or alternatively, a variation of the position of the light sensitive image capturing device relative to the specimen chamber may result in a variation of the imaging direction of the light sensitive image capturing device.

Additionally or alternatively, the light sensitive image capturing device may have more than one imaging direction. For example, the light-sensitive image capturing device may comprise, a plurality of cameras, which are arranged such that they have different imaging directions relative to the structure. For example, the image capturing device comprises two, three or more cameras.

Additionally or alternatively, the particle optical system may provide a first imaging direction and the light sensitive image capturing device may provide a second imaging direction.

According to a further embodiment, the detecting of the light, rays comprises: detecting of a laser beam, which has been reflected at the structure.

Algorithms for generating surface models from reflected laser beams of a laser scanner are disclosed in the Ph.D thesis "Model-based Analysis and Evaluation of Point Sets from Optical 3D Laser Scanners", written by Christian Teutsch (Otto-von-Guericke-Universitaet, Magdeburg, Germany), published by Shaker Verlag, Herzogenrath, Germany; the contents of which are incorporated herein in its entirety.

For example, the particle beam microscope comprises a laser scanner, which is configured to scan at least a portion of the structure and/or the microscope portion. The laser scanner may be configured such that the reflected laser beams are detected by performing at least one of the following: measuring the time-of-flight, in particular by timing the round-trip time of a pulse of light, performing phase comparison and/or performing triangulation.

Furthermore, the laser scanner may be configured to determine the position and orientation of the structure depending on the detected reflected laser beams. Thereby, a position and an orientation of the surface model of the structure relative to the object region may be determined.

According to a further embodiment, the generating of the surface model of the structure comprises: generating a first surface model of a first portion of the structure in a first position of the structure relative to an image acquisition device and/or to the objective lens; generating a second surface model of a second portion of the structure in a second position of the structure relative to the image acquisition device and/or the objective lens; and combining the first surface model and the second surface model to the surface model of the structure.

Accordingly, it is possible to generate a comparatively large surface model, which extends the field of view of the image acquisition device or the particle microscope. In particular, this allows to use the particle microscope to generate a surface model of an extended object.

The first and the second surface model may be generated depending on the detected light rays and/or particles. The first surface model and the second surface model may be adjacent and non-overlapping. Alternatively, the first surface model, and the second surface model may be partially overlapping. The first position and the second position are measured relative to the image acquisition device and/or relative to the objective lens.

Embodiments provide a particle beam microscope system, comprising: an objective lens, having an object region; an object holder which is configured such that an object is mountable on the object holder; a positioning device, which is configured to adjust a position and/or an orientation of the object holder relative to the object region; a detecting device, which is configured to detect light rays, which emanate from a structure, and/or particles, which emanate from the structure, wherein the structure comprises at least a portion of the surface of the object holder and/or at least a portion of a surface of the object; a computer, which is configured for signal communication with the positioning device and the detecting device, wherein the computer is further configured to: generate a surface model of the structure depending on the detected light rays and/or the detected particles; determine a position and an orientation of the surface model of the structure relative to the object region; determine a measurement location relative to surface model of the structure; and to position the object depending on the determined surface model of the structure, the determined position and orientation of the surface model of the structure and the determined measurement location.

Accordingly, a article beam microscope is obtained, which allows an automatic, fast and easy-to-perform positioning of the object relative to the objective lens within a short time.

The computer may be configured to automatically perform the positioning of the object. It is also conceivable that the computer displays the surface model of the structure, the position and orientation of the surface model of the structure and the measurement location on a display. The computer may further be configured to position the object depending on the user input. For example, the computer may be configured to determine a measurement location relative to the surface model of the structure depending on an input of the user.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessary exhibit each and every, or any, of the advantages identified herein.

DETAILED DESCRIPTION OF EXEMPLARY EMBODIMENTS

It should be noted in this context that the terms "comprise", "include", "having" and "with", as well as grammatical modifications thereof used in this specification or in the claims, indicate the presence of technical features such as stated components, figures, integers, steps or the like, and by no means preclude the presence or addition of one or more alternative features, particularly other components, figures, integers, steps or groups thereof.

Figure 1:
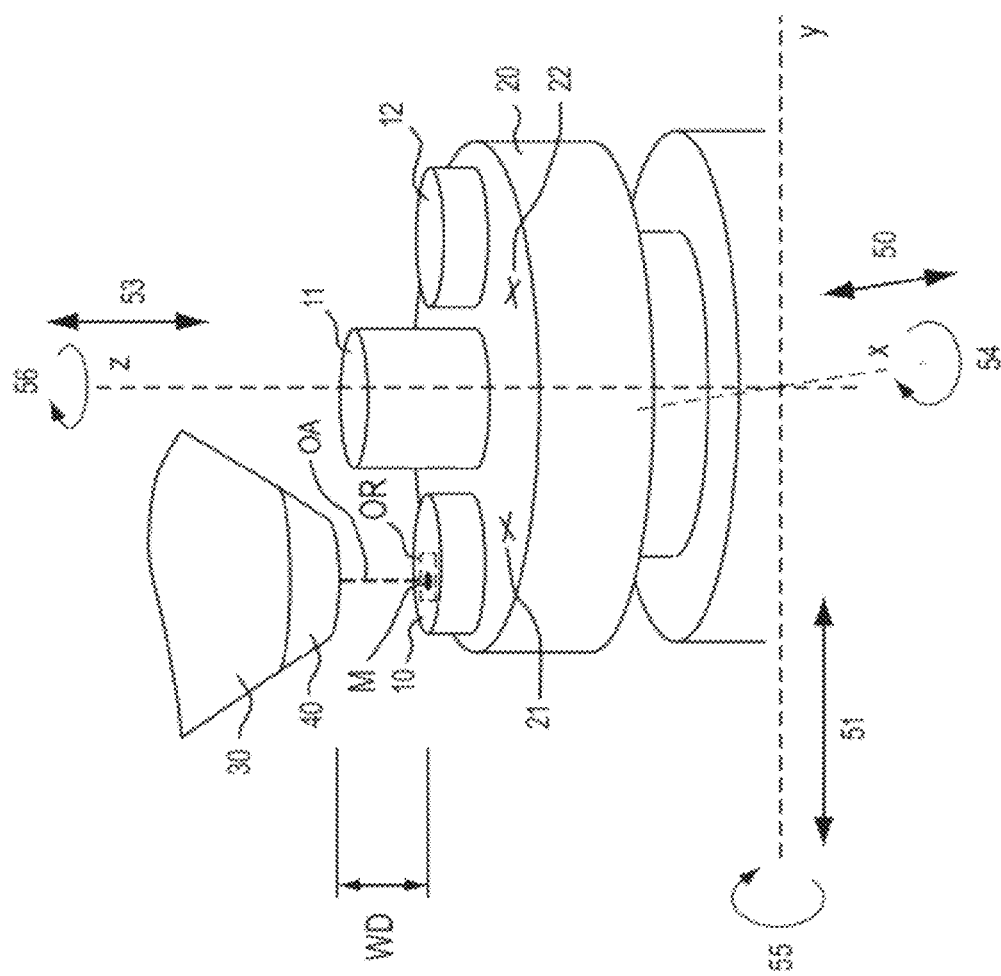
FIG. 1 schematically illustrates an object and an object holder which are arranged close to an objective lens and a BSE-detector according to an exemplary embodiment.

FIG. 1 schematically shows a structure, which is arranged close to an objective lens 30 of a particle beam microscope, which is, for example, a scanning electron microscope. The objective lens 30 has an optical axis OA and an object region OR. The object region OR is a spatial region, into which the particle beam of the particle beam microscope is focused. In other words, a surface region of an object, which is arranged in the object region OR, is imagable by the particle beam microscope. The object region OR is located at a working distance WD spaced away from the objective lens 30. The working distance WD and the extent of the object region OR depend on the design of the particle optical system of the particle beam microscope as well as on operation parameters of the particle optical system, such as the magnification.

A first object 10 and a second object 11 and a third object 12 are mounted on an object holder 20. The object holder 20 is attached to a positioning device, which is not illustrated in FIG. 1. The positioning device is configured such that the object holder 20 is independently movable along an X-axis, along a Y-axis and a Z-axis of a coordinate system. This is illustrated by the double arrows 50, 51 and 53. Thereby, the positioning device is configured to position the object holder with three degrees of freedom. The positioning device may further be configured such that the object holder 20 is rotatable about the X-axis, the Y-axis and the Z-axis. In FIG. 1 this is illustrated by arrows 54, 55 and 56. Thereby, the positioning device may be configured such that the object holder 20 is positionable in six degrees of freedom. The positioning device may comprise one or more actuators. The actuators may be piezo actuators and/or step motors.

At an end face of the objective lens 30, a detector 40 is arranged, which is configured to detect back scattered particles, which have been scattered at the object 10. In case of the particle beam microscope being a scanning electron microscope, the detector 40 may be a BSE-detector (back scattered electron detector). The particle beam microscope may comprise further particle detectors, which are not illustrated in FIG. 1

In order to acquire an electron microscopic image of a location M on the surface of the first object 10, the first object 10 has to be arranged at a position and an orientation, such that the location M is located in the object region OR. The orientation may, for example, be defined by three angles.

The object holder 20 may comprise marks 21, 22. The marks 21, 22 are configured such that they are detectable in an image of a light-sensitive image capturing device, such as a CCD-camera, and/or by scanning the primary beam of the particle beam microscope across the marks.

In the exemplary embodiments, which are discussed with reference to the following figures, a surface model is generated from the structure for performing a precise positioning of the objects 10, 11, 12 relative to the objective lens 30. The structure comprises a portion of the surface of the objects 10, 11, 12 and/or a portion of the surface of the object holder 20. Additionally or alternatively, also a surface model of a microscope portion (such as a portion of the objective lens 30 and/or the detector 40) is generated to ensure a collision-free positioning of the objects 10, 11, 12.

The surface models may be generated, for example from camera images, which are arranged in the specimen chamber and/or in the load-lock chamber of the microscope. The surface models may also be generated from particle microscopic images and/or by using a laser scanner.

Figure 2:
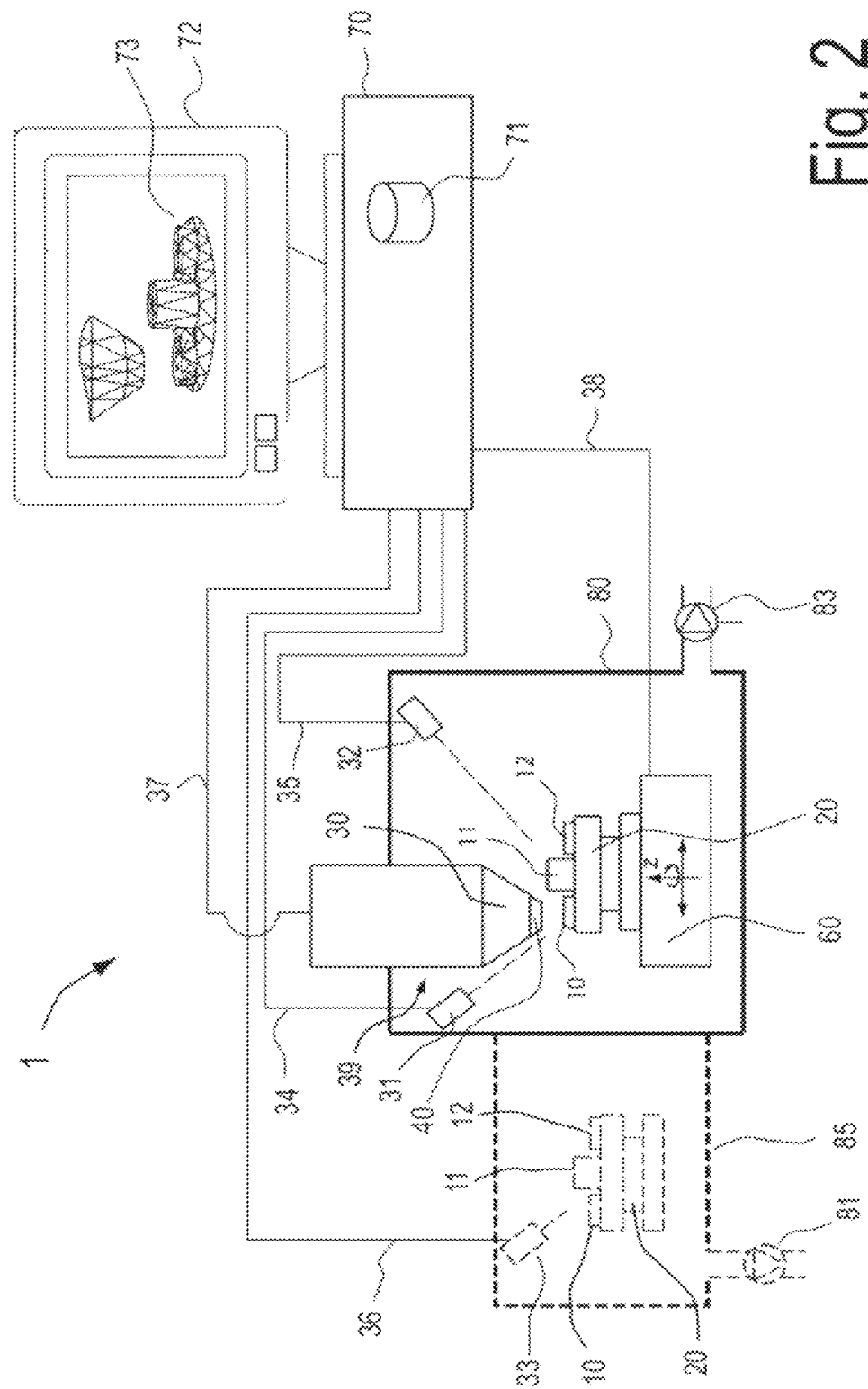
FIG. 2 schematically shows a particle beam system according to an exemplary embodiment.

FIG. 2 is a schematical illustration of a particle beam microscope system 1 according to an exemplary embodiment. The particle beam microscopy system 1 may comprise a scanning electron microscope. The specimen chamber 80 comprises a vacuum pumping system 83, which is configured to evacuate the specimen chamber 80 to a vacuum level, which is suitable for conducting measurements with the primary beam. The vacuum pumping system 83 may comprise a fore pump and a turbo molecular pump. The vacuum level for conducting measurements may be in a range of between 1 mbar to $10^{-7}$ mbar. In order to avoid venting the specimen chamber 80 for changing the samples 10, 11, 12, a load-lock chamber 85 may be connected to the specimen chamber 80 which comprises a further vacuum pumping system 81. The samples 10, 11, 12, which are attached to the object holder 20, are first introduced into the load-lock chamber 85. After having evacuated the load-lock chamber 85, the samples 10, 11, 12 and the object holder 20 are transferred from the load-lock chamber 85 to the specimen chamber 80 and the object holder 20 is attached to the positioning device 60 of the particle beam microscope.

The particle beam microscope comprises a first camera 31, such as a ODD-camera, which is arranged in the specimen chamber 80. The first camera 31 is configured to acquire digital images of at least a portion of the surface of the first object 10 and/or a portion of the surface of the object holder 20. The first camera 31 is connected to the computer 70 of the particle beam microscope system 1 via a first signal line 34. The computer 70 comprises a storage device 71. The storage device 71 is configured to store the digital image of the first camera 31. The positioning device 60 may be configured such that the first, second and third object 10, 11, 12 and the object holder 20 are imagable by the first camera 31 from different imaging directions. For example, the positioning device 60 may perform a rotation about the Z-axis by a predetermined angle, such that the first, second and third object 10, 11, 12 and/or the object holder 20 is imagable by the first camera 31 from at least two different imaging directions. Depending on the images of the first camera 31, the computer 70 calculates a surface model of the structure, which comprises at least a portion of a surface of the first, second, third object 10, 11, 12, and/or the object holder 20.

The particle beam microscope 1 may further comprise a second camera 32, such as a COD-camera, which is also arranged in the specimen chamber 80. The second camera 32 and the first camera 31 have different imaging directions relative to the structure. By using two cameras, it is possible to acquire digital images from the structure from different imaging directions, without having to change the position or orientation of the structure of the positioning device 60.

The particle beam microscope system 1 further comprises a particle optical system 39, which has an objective lens 30. The objective lens 30 comprises an end face, which faces the object plane of the particle optical system 39. At the end face, a detector 40, such as a BSE-detector may be arranged. It is also conceivable that the detector is attached to a wall of the specimen chamber 80 or is received within the particle optical system. The particle optical system 39 and the detector 40 are connected to the computer 70 via a third signal line 37. Through the third signal line 37, control signals are transmitted between the computer 70 and the particle optical system 39. Depending on the signals of the detector 40, the computer 70 generates particle microscopic images, which represent digital images.

Digital images, which have been acquired by the first camera 31, and/or the second camera 32 and/or which have been generated depending on the signals of the detector 40 are stored in the storage device and later processed by the computer 70. Depending on the digital images, the computer calculates a surface model of the structure. The structure can be used to position the objects 10, 11, 12 relative to the objective lens to acquire particle microscopic images.

The computer 70 is further configured to calculate a surface model of a microscope portion of the particle beam microscope system 1 depending on the digital images. Alternatively, it is possible that the computer calculates the surface model of the microscope portion depending on a CAD-model. The microscope portion may, for example, be a surface of an object-side end portion of the objective lens 30 and/or a portion of the surface of the detector 40. The computer 70 is further configured to combine the surface model of the structure and the surface model of the microscope portion to a combined surface model. The combined surface model can be used to monitor a distance between the structure and the microscope portion in order to avoid collisions during the positioning process.

A third camera 33, such as a CCD-camera, may be arranged in the load-lock chamber 85. The third camera is connected to the computer 70 via a fourth signal line 36. Furthermore, the load-lock chamber 85 may comprise a positioning device, which is configured such that digital images are acquirable by the third camera 33 from different imaging direction relative to the structure. In the load-lock chamber 85, more than one camera may be arranged. The cameras in the load lock chamber may be arranged such that they have different imaging directions relative to the structure.

The cameras in the load-lock chamber 85 may be configured to generate digital image data, which show or represent at least a portion of the structure, such that the surface model of the structure is calculable depending on the digital image data. In the load lock chamber, the field of view of the camera is not obstructed by the presence of an objective lens and/or detectors.

Depending on the generated surface model, the position and orientation of the structure in the specimen chamber 80 may be determined by comparing the surface model with the digital images, which have been generated in the specimen chamber.

Figure 3:
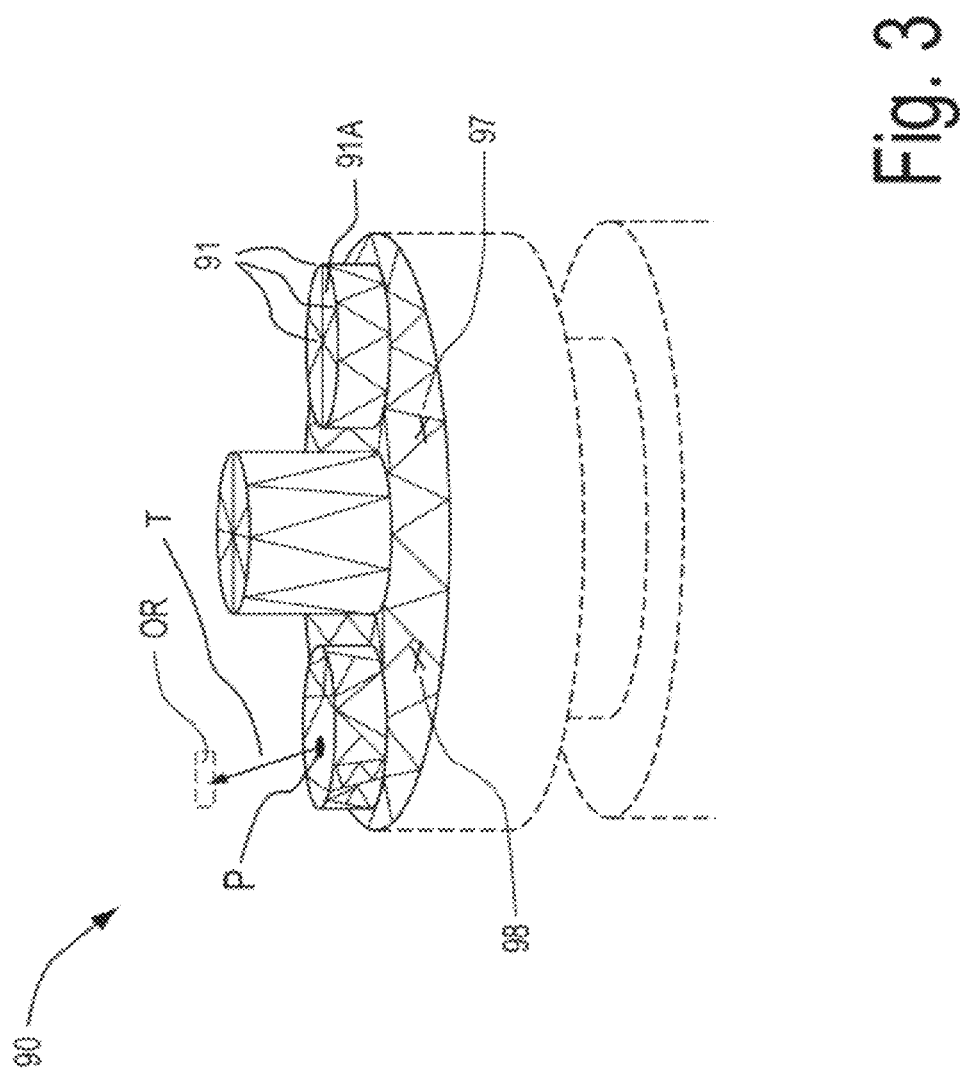
FIG. 3 schematically shows a surface model of a structure which is obtained by a method according to an exemplary embodiment.

FIG. 3 schematically shows the generated surface model 90 of the structure in the example, shown in FIG. 3, the structure comprises the top surfaces and the lateral surfaces of the first, second and third object 10, 11, 12. Furthermore, the structure comprises the top surface of the object holder 20. Those surfaces of the object holder, which are not represented by the surface model of the structure 90 are indicated in FIG. 3 by dashed lines. The surface model of the structure 90 comprises a plurality of points 91, wherein the plurality of points 91 are connected by geometric objects such as line segments or plane segments 91A.

Furthermore, the surface model of the structure 90 comprises marks 97, 98, which represent the marks 21, 22 on the structure, as illustrated in FIG. 1.

After having generated lee surface model of the structure 90, the computer 70 (illustrated in FIG. 2) is configured to determine the position and orientation of the surface model 90 relative to the object region OR, as will be discussed in detail with reference to FIG. 4.

The computer 70 is further configured to show a two-dimensional representation 73 on a display 72 of the computer 70, such as illustrated in FIG. 2. This allows the user to select a location, at which he wants to perform a measurement. The user may select a view of the representation 73 on the display. Based on the selected view, it is easier for the user to decide at which location he wants to perform the measurement. The representation 73 may be superimposed on a camera image showing the structure and/or the microscope portion.

Based the user input, the computer 70 determines a measurement location P relative to the surface model 90. The measurement point P corresponds to a location M (as shown in FIG. 1), at which a measurement is to be taken.

Depending on the determined position and orientation, of the surface model 90 relative to the object region OR, as well as depending on the measurement location P, the computer calculates a positioning path P.

The positioning path may comprise translational movements and/or rotational movements. In FIG. 4, the positioning path T is schematically indicated as a vector, which connects the measurement location P with the object region. OR. However, it is also conceivable that the positioning path T comprises an arcuate path of translatory movement. After having determined the positioning path T, the computer transmits control signals to the positioning device 60 for arranging a location on the structure, which corresponds to the measurement location P within the object region OR.

Figure 4:
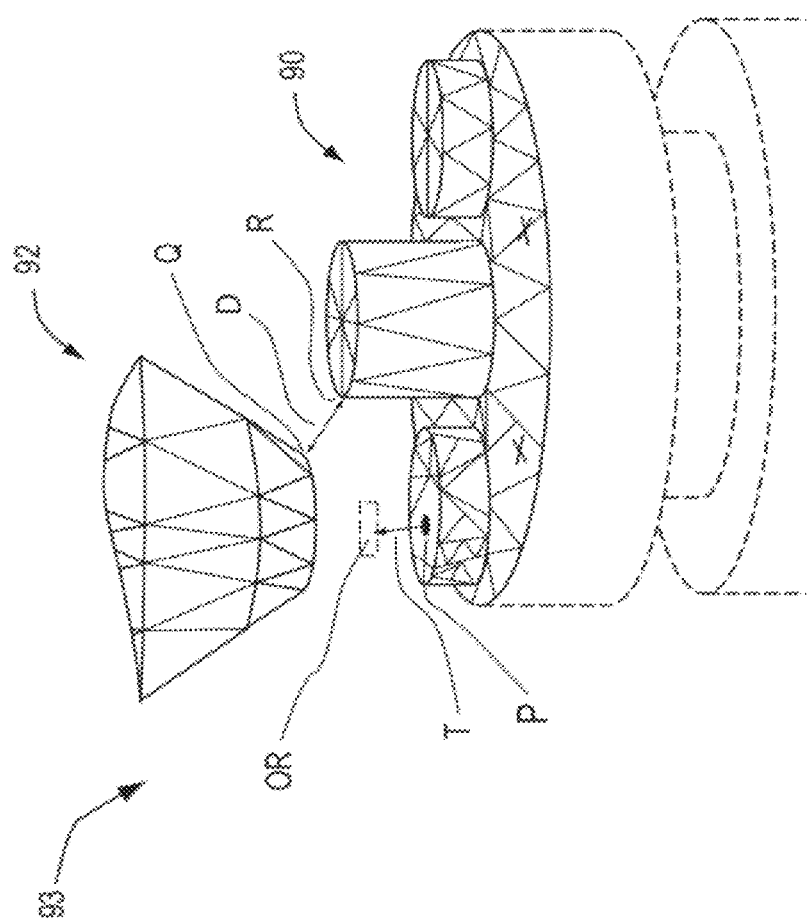
FIG. 4 schematically shows a combined surface model, which is obtained according to an exemplary embodiment.

FIG. 4 shows, in an exemplary manner, a combined surface model 93, which has been generated by combining the surface model of the structure 90 with a surface model of a microscope portion 92. In this context, the term combining may be understood to arrange the surface model of the structure 90 and the surface model of the microscope portion 92 relative to each other such that they represent the position and orientation of the structure relative to the microscope portion in the particle beam microscope.

The surface model of the microscope portion 92 may be generated depending on the detected light rays. Alternatively or additionally, the surface model of the microscope portion 92 may be determined depending on a contact-based measurement. The contact-based measurement may be performed by a coordinate measuring machine.

The computer 70 is configured to calculate a distance D between the surface model of the structure 90 and the surface model of the microscope portion 92 depending on the combined surface model 93. For example, the computer calculates all distances between pairs of points of the combined surface models 93, wherein each pair of points consists of a point of the surface model of the structure 90 and a point of the surface model of the microscope portion 92. Depending on the determined distances of the pairs of points, the smallest distance D may be determined. The distance D, which is shown in FIG. 4, is the distance between the point Q of the surface model of the microscope portion 92 and the point R of the surface model of the structure 90. In case the distance D is smaller than a predetermined permissible distance, the particle beam microscope issues a warning signal or a notification. Furthermore, the particle beam microscopy system 1 may be configured to stop positioning movements which lead to a distance between the microscope portion and the structure, which is smaller than the permissible distance. The particle beam microscope system 1 is configured to determine a positioning path T depending on the combined surface model 93, wherein the positioning path T is determined such that a collision between the microscope portion and the structure is avoided.

Figure 5:
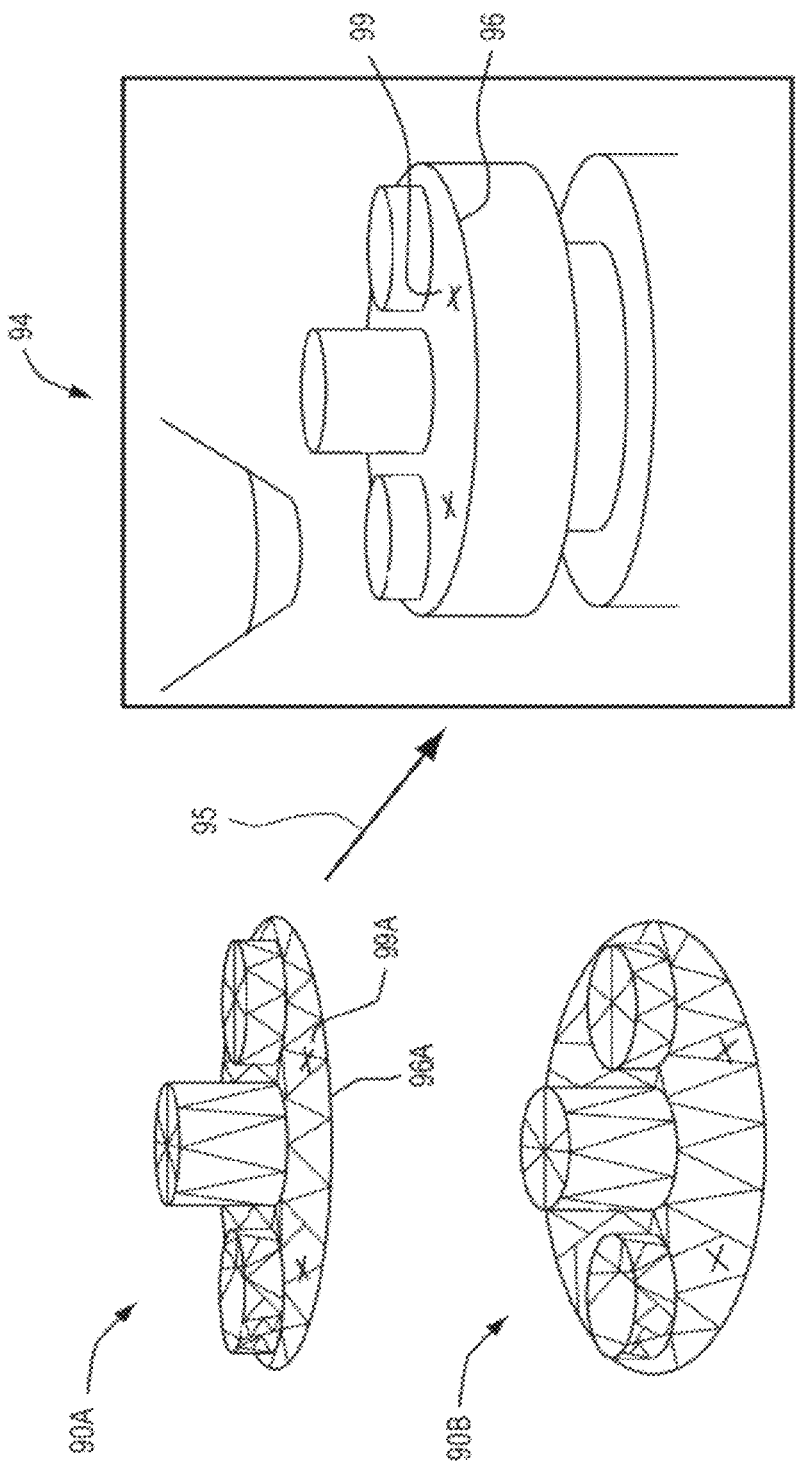
FIG. 5 schematically shows a determining of the position and the orientation of the surface model according to an exemplary method.

FIG. 5 schematically snows in an exemplary manner the determining of the position and orientation of the surface model of the structure relative to the object region. After the surface model 90 has been generated, the first camera 31 (illustrated in FIG. 2) acquires a digital image 94, as illustrated an FIG. 5. In other words, the first camera 31 is a position acquisition camera of the particle beam microscope system 1. The computer 70 is configured to compare the digital image 94 with the surface model of the structure 90. For example, the digital image 94 is compared with two-dimensional representations 90A, 90B which represent the surface model in different orientations and positions. The comparing may, for example, comprise extracting an edge 96 of the structure 90 from the digital image 94 and comparing the extracted edge 96 with an edge or a rim 96A of the representation 90A of the surface model 90. Furthermore, the comparing may comprise extracting the mark 99, shown in a digital image 94, with a mark 99A of the representation 90A of the surface model 90. The extracting of the edge 96A and/or the mark 99 may comprise segmenting the digital image 94.

Based on the comparison, the two dimensional representation 90A is identified as representing the position and orientation of the structure. Thereby, the position and orientation of the surface model of the structure 90 is determined.

It is conceivable that the determining of the position and the orientation of the surface model 90 comprises determining digital images from at least two different imaging directions relative to the structure. The digital images may represent stereoscopic image data.

Figure 6:
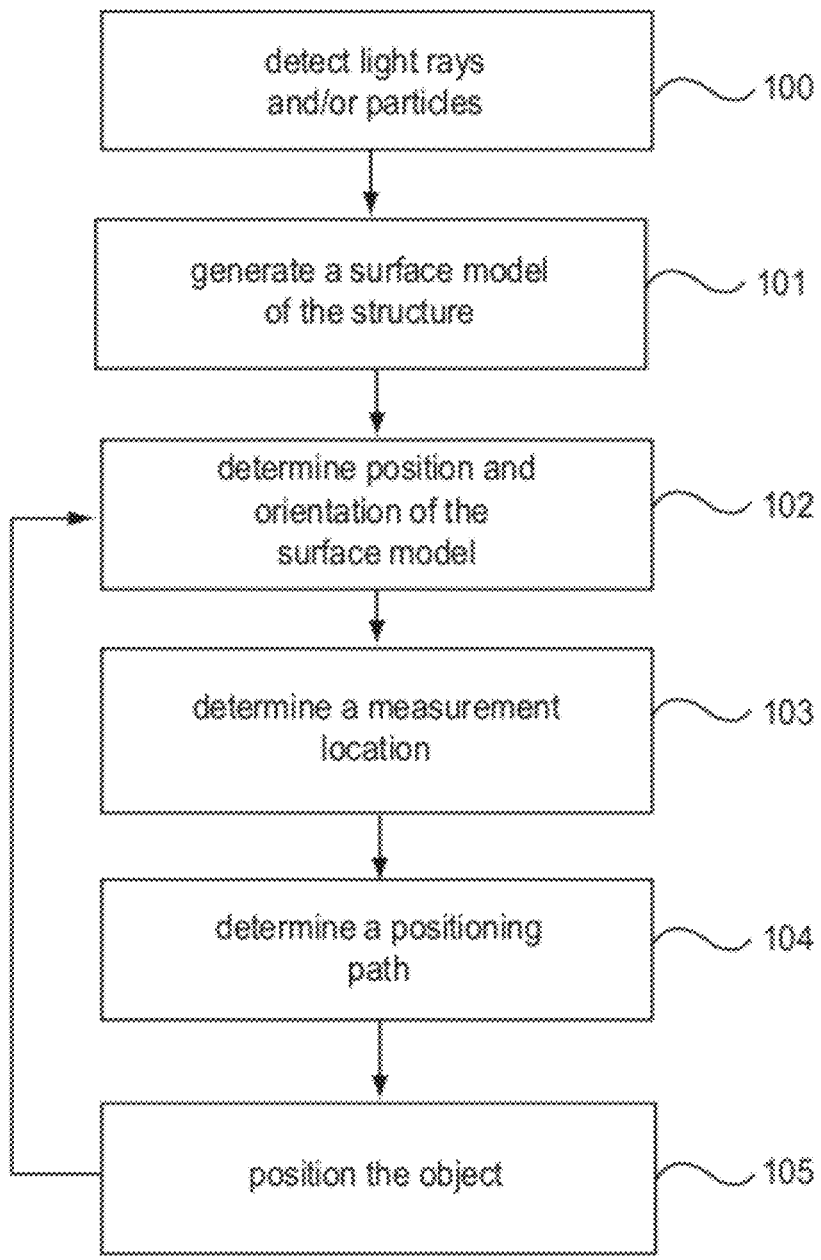
FIG. 6 is a flow-chart, which schematically illustrates an exemplary method of operating a particle beam microscope.

FIG. 6 is a flow-chart of an exemplary method for positioning the object within a particle beam microscope system 1, as shown in FIG. 2, by using the surface model of the structure 90, as shown in FIG. 3. A detecting 100 of light rays, which emanate from the structure is performed by the first and/or second camera 31, 32. Depending on the geometry of the structure and/or the required accuracy for the calculation of the surface model 90, one or more images or the first camera 31 may be sufficient to calculate the surface model of the structure 90. The acquired digital images, which represent digital image data, are transmitted via the first and the second signal lines 34, 35 to the computer 70 and are stored in the storage device 71. Depending on the acquired digital images, a generating 101 of the surface model 90 is performed by the computer 70. The generated surface model 90 is stored in the storage device 71 of the computer 70.

Alternatively or additionally, the computer 70 may be configured to calculate the surface model depending on signals of a particle detector, such as the detector 40, which is illustrated in FIG. 2. Exemplary embodiments for calculating the surface model of the structure from the detected particles will be discussed with reference to FIGS. 9 to 12.

Depending on the known viewpoint positions, the known imaging directions and the known magnifications of the first and/or second camera 31, 32, and/or depending on the generated surface model 90, a determining 102 of a position and orientation of the surface model of the structure 90 relative to the object region OR is performed.

Alternatively or additionally, the determining 102 of the position and orientation of the surface model of the structure relative to the object region may be performed depending on signals between the positioning device 60 and the computer 70.

Alternatively or additionally, the determining 102 of the position and orientation of the surface model of the structure 90 is performed depending on signals of a particle detector, such as the particle detector 40, as shown in FIG. 2. In particular, the determining 102 of the position and orientation of the surface model of the structure may be performed depending on particle microscopic images.

The computer 70 is configured to display a two-dimensional representation 73 of the surface model on the display 72. Based on the shown representation 73, the user can select a location at which he wants to acquire a particle microscopic image. Depending on the user input, the computer performs a determining 103 of a measurement location P relative to the surface model of the structure 90.

Depending on the position and orientation of the surface model 90 relative to the object region. OR and the determined measurement point P, the computer determines 104 a positioning path. Depending on the determined positioning path T the computer transmits signals to the positioning device 60 to control a positioning 105 of the object. After the positioning of the object, the location of the object 10, at which a measurement is to be taken, is arranged in the object region OR. Then, the computer 70 may again determine 102 the position and orientation of the surface model 90 or may determine 103 a measurement location depending on an input of the user.

Figure 7:
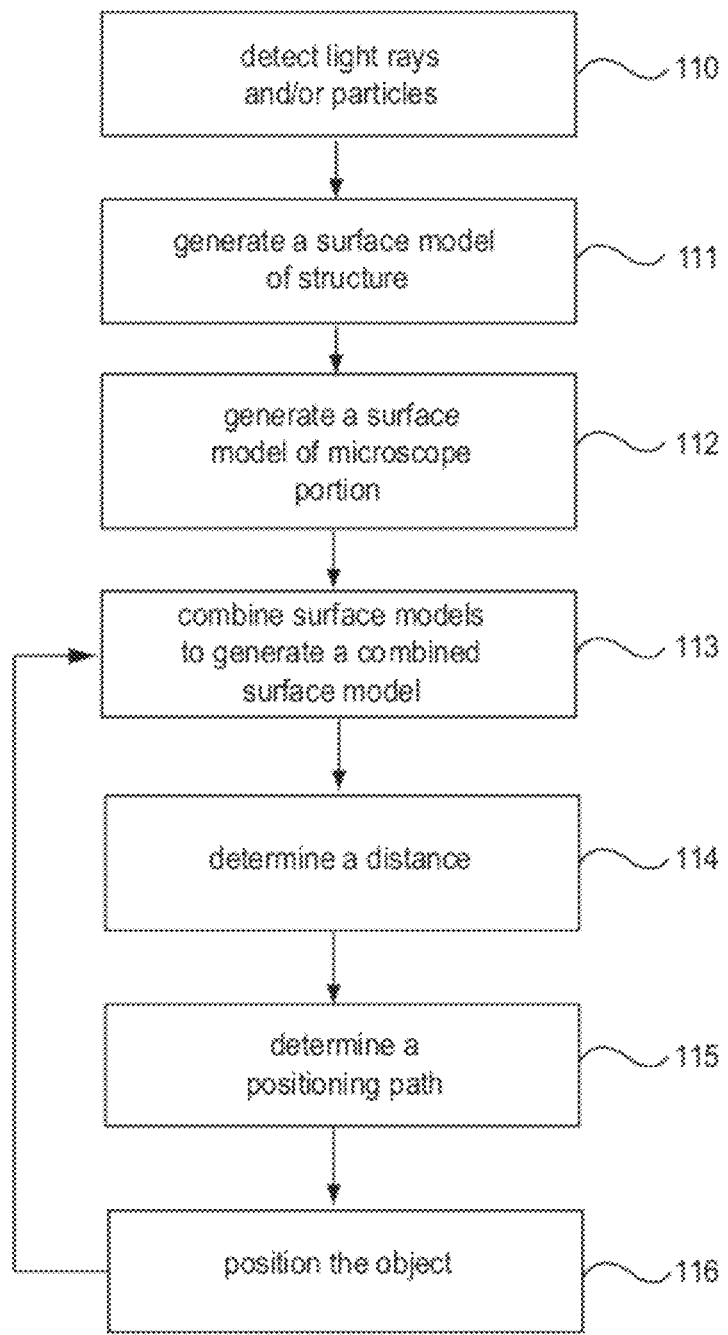
FIG. 7 is a flow-chart, which schematically illustrates a further exemplary method of operating a particle beam microscope.

FIG. 7 illustrates a flow-chart of a further exemplary method, which is performed by the particle beam microscope system 1, as shown in FIG. 2, wherein the combined surface model 93, as shown in FIG. 4 is used for collision detection. The method steps of detecting 110 the light rays and/or particles and generating 111 the surface model of the structure are performed as has been discussed with reference to FIG. 6.

In the exemplary method shown in FIG. 7, the computer generates 112 also a surface model of a microscope portion 92. The microscope portion 92 may for example comprise at least a portion of the surface of the detector 40, an objective lens 30, a manipulator, a gas injection system, and/or a wall of the specimen chamber 80. Then, the computer 70 combines the surface model of the structure 90 with the surface model of the microscope portion 92 to form a combined surface model 93. In the combined surface model 93, the surface model of the structure 90 is arranged relative to the surface model of the microscope portion 92 such that it corresponds to a relative orientation and a relative position of the structure relative to the microscope portion in specimen chamber 80. The combining 113 may be performed depending on digital images of the first camera, the second camera 32, and/or signals of the detector 40. Alternatively or additionally, the combining 113 may be performed depending on control and/or sensor signals between the positioning device 60 and the computer 70.

The surface model of the structure 90 and the surface model of the microscope portion 92 may be generated consecutively. However, it is also conceivable that the surface model of the structure 90 and the surface model of the microscope portion 92 are generated simultaneously, in particular depending on the same digital images. Depending on the combined surface model 93, a distance between the surface model of the structure and the surface model of the microscope portion is determined. Depending on the combined surface model 93 and the determined distance, the computer 70 determines 115 a positioning path T. The positioning path T is determined such that a collision between the structure and the microscope portion is avoided. After the positioning 116, the computer 70 again generates a combined surface model 93. After having again determined the distance, the positioning path is again determined such that the collision between the structure and the microscope portion is avoided. Then, the computer again controls the positioning 116 along the positioning path T.

Figure 8:
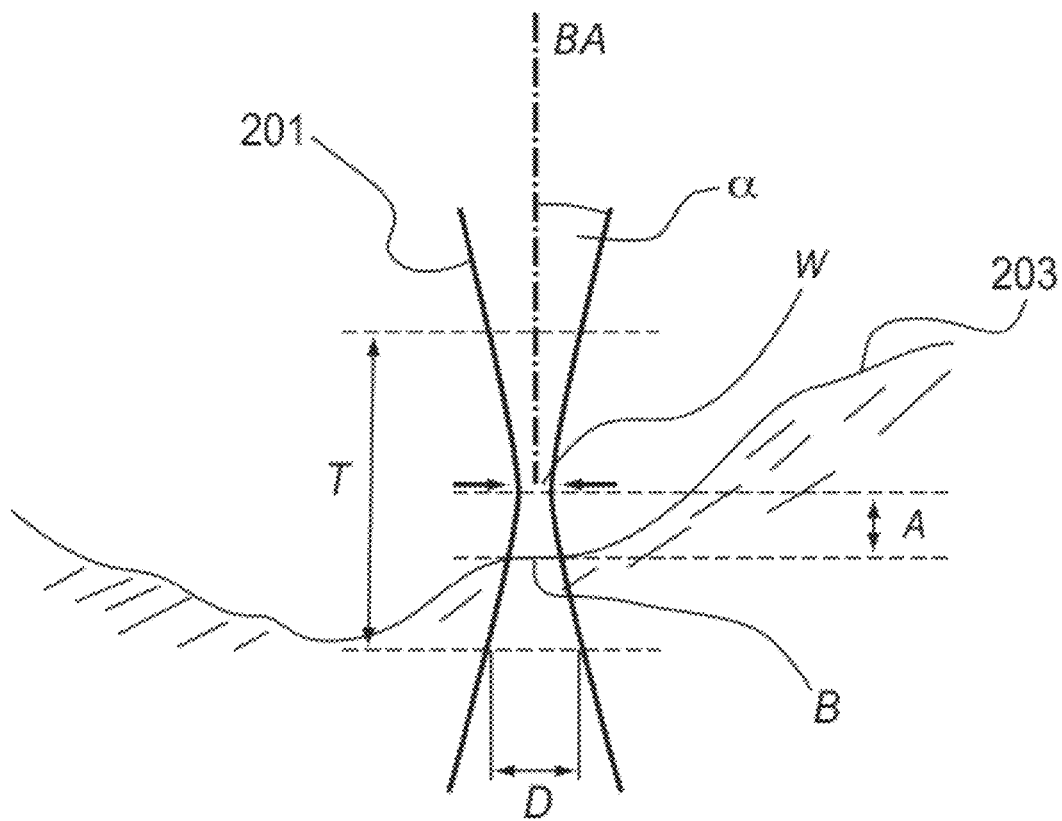
FIG. 8 schematically illustrates the acquiring of the surface model of a structure by using different focus distances of the particle optical system, as shown in FIG. 2.

FIG. 8 shows in an exemplary manner how the surface model of the structure is generated depending on image data, which have been acquired by detecting particles. The image data are generated at different focus distances of a primary beam 201 of the particle optical system 303 (illustrated in FIG. 2). The primary beam 201 is scanned across the structure 203. The primary beam 201 comprises a beam waist W. The beam waist W is a portion of the primary beam 201, in which the primary beam has a smallest, beam diameter measured perpendicular to a beam axis BA of the particle optical system. A region B of the structure 203, which is located at a distance A away from the beam waist W is irradiated with a beam diameter of the primary beam 201, which is greater than the beam diameter of the beam waist W.

During the scanning of the primary beam 201 across the structure 203, image data are generated. The image data represent a discrete sampling of the structure 203. For example, the image data may comprise 1024 times 1024 pixel data values. Therefore, each pixel data value represents a portion of the structure 203, having a diameter D. For example, M times M pixel data values are acquired from a square-shaped portion of the structure having side lengths L. The diameter of the portion of the structure 203, which is represented by a pixel, data value is L/M.

In case the diameter of the primary beam at the irradiated portion B is greater than the diameter D, this causes a lower resolution in the image data of the digital image. A depth of focus T of the primary beam 201 may be defined as a range along the beam axis BA, in which the diameter of the particle beam 201 is smaller than the diameter D. The depth of focus T depends on an aperture angle α of the primary beam 201. The aperture angle α may be defined as a maximum angle, which is formed by the particles of the primary beam 201 with the beam axis BA.

When the distance A of the portion B of the object surface OS from the beam waist W is smaller or equal to half of the depth of focus T, this does not cause a reduced resolution in the image data of the digital image. However, in case the distance A is greater than half of the depth of focus T, this leads to a reduced resolution of the image data.

The focus distance may be defined as the distance of the beam waist W from a reference point of the particle optical system. The reference point may, for example, be a principle plane of the objective lens 30 (shown in FIG. 2). A variation of the focus distance thereby causes a variation of the distance A. Hence, a variation of the focus distance may lead to a different resolution of the image data which represent the portion B. A comparatively high resolution of the portion. B is achieved by a distance A of the portion B from the beam waist W of the primary beam 201 being smaller than half of the depth of focus T.

The focus distance of the particle optical system 39 may be varied by varying an excitation of the objective lens 30 (shown in FIG. 2).

Figure 9:
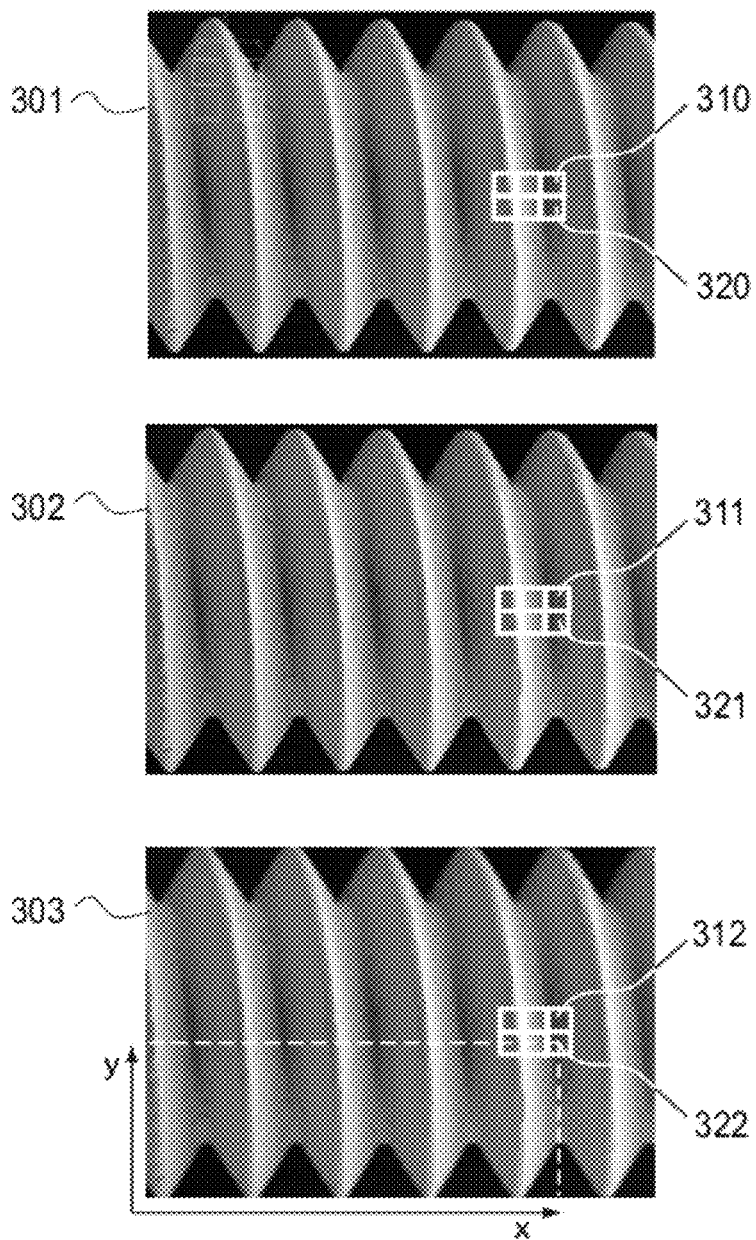
FIG. 9 schematically illustrates the generating of the surface model of the structure from a plurality of particle microscopic images.

FIG. 9 schematically illustrates how the surface model, of the structure is generated depending on a plurality of digital images 301, 302, 303 according to an exemplary method. Each of the digital images 301, 302, 303 has been generated by scanning the particle beam across at least a portion of the structure. The images 301, 302, 303 show a same portion of the structure. The digital images 301, 302, 303 have been acquired at different focus distances of the particle optical system 39. Therefore, portions in the images 301, 302, 303, which represent a common portion of the structure, may have a different resolution. For simplicity of illustration, only three digital images are shown in FIG. 9. However, the calculation of the surface model may be performed depending on more than 5, more than 10, more than 20, more than 50 or more than 100 digital images, which have been acquired at mutually different focus distances. For example, the surface model may be generated depending on less than 500 or less than 200 digital images.

A plurality of image regions 310, 311, 312, 320, 321, 322 is selected from the image data of each of the digital images 301, 302, 303. For simplicity of illustration, only six image regions are shown in each of the digital images 301, 302, 303.

The plurality of image regions of a digital image may cover the whole, or substantially the whole digital image. The image regions 310, 311, 312, 320, 321, 322 of the digital images 301, 302, 303 are selected such that the image regions 310, 311, 312, 320, 321, 322 may be divided into stacks, which show the same portion of the structure.

In the embodiment, which is illustrated in FIG. 9, a first stack of image regions consists of the image regions 310, 311 and 312. Each of the image regions 310, 311, 312 of the first stack show a first common object portion. A second stack of image regions consists of the image regions 320, 321 and 322. Each of the image regions 320, 321 and 322 shows a second common object portion. The first common object portion is different from the second common object portion. In the exemplary embodiment, which is shown in FIG. 9, the first common object portion is adjacent and non-overlapping to the second common object portion. However, the first common object portion may partly overlap with the second common object portion. It is also conceivable that the first common object portion and the second common object portion are neither adjacent nor overlapping, but located at a distance spaced apart from each other. For simplicity of illustration, only six stacks of image regions are shown in FIG. 9. For example, more than 100, more than 10,000 or more than $10^6$ stacks of image regions may be generated from the digital images, wherein each of the stacks represents a different portion of the structure. For example, less than $10^9$ stacks of image regions may be generated from the digital images.

The stacks of image regions, which represent a common object region may be determined by identifying object features, which appear in each of the digital images 301, 302, 303. For example, the identifying of object, features may comprise identifying edges, identifying a difference among image data and/or determining a frequency of image data of an image region. The identifying of the object features may comprise segmenting each of the digital images 301, 302, 303.

An image region consists of a group of pixels. An image region may have the form of a square. For example, an image region may consist of 4 times 4 pixels, of 8 times 8 pixels or of 10 times 10 pixels. An image region may be a pixel cluster, which has an irregular or non-symmetrical shape. An image region may consist of a single pixel.

The computer 70 (illustrated in FIG. 2) is configured to determine for each of the stacks of image regions an image region which has the highest resolution among all image regions in the respective stack and which is denoted herein as in-focus region. The in-focus region is selected from the image regions of the respective stack.

For example, from the image regions 310, 311 and 312, which form the first stack, the in-focus image region is selected. Furthermore, from the image regions 320, 321, 322, which form the second stack, a second in-focus region is selected. Image region 311 is the in-focus region of the first stack and image region 322 is the in-focus region of the second stack.

Each of the image regions represents an X-coordinate value and a Y-coordinate value in a plane perpendicular to the optical axis of the particle optical system. The X-coordinate value and the Y-coordinate value of the image region 322 are schematically illustrated in FIG. 9. Furthermore, the focus distance at which the image data of an image region have been acquired, represents a Z-coordinate value of a coordinate axis, which is oriented parallel to the optical, axis of the particle optical system.

The X-coordinate values, Y-coordinate values and Z-coordinate values of all in-focus image regions represent a surface model of the structure.

Figure 10:
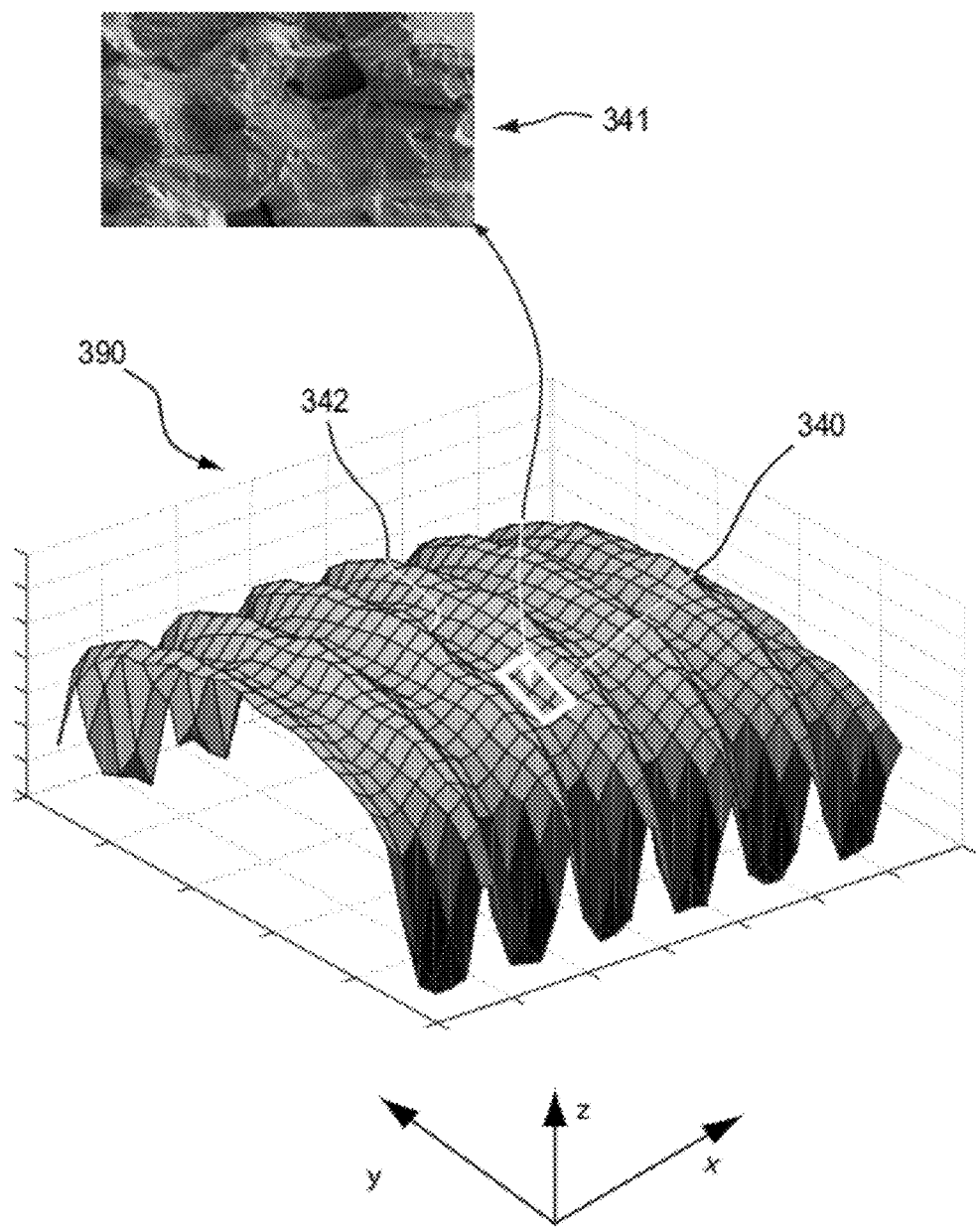
FIG. 10 schematically shows the surface model of the structure which has been generated according to an exemplary method, as shown in FIGS. 8 and 9.

FIG. 10 schematically shows a surface model 390 which has been generated according to the method which has been described with reference to FIG. 9. The surface model 390 is a two dimensional function, which assigns a function value to discrete coordinate values in the X-Y-plane, wherein the function value represents a coordinate value of the Z-coordinate axis. Each of the function values of the two dimensional function corresponds to a focus distance of one of the determined in-focus regions within a stack. The discrete coordinate values in the X-Y-plane correspond to the X-coordinate values and Y-coordinate values of the in-focus regions. The X-Y-plane corresponds to a plane, which is oriented perpendicular to the optical axis of the particle optical system.

The computer 70 (illustrated in FIG. 2) is configured to store a measurement location 340 relative to the surface model 390. For example, the computer 70 may be configured to determine which location of the surface model of the structure represents a region at which the primary beam impinges. The computer 70 is configured to assign image data of an image 341, which has been generated by scanning the primary beam at the measurement location 340 to the stored measurement location 340. The image 341 may, for example, be a secondary electron image or an image, which has been generated by detecting back scattered electrons. The storing of the measurement location 340 may comprise storing of X-coordinate values, Y-coordinate values and Z-coordinate values of the measurement location 340.

This allows a user or an evaluation routine, of the computer to determine based on the surface model 390, from which portions of the structure high resolution images have already been generated. Furthermore, it is possible to interpret the image data of the image 341 in dependence on the topography data of the surface model 390. For example, the surface portion, which is shown in image 341 may have a surface inclination, which is not recognizable in the image data of the image 341. However, by storing the measurement location 340 relative to the surface model 390, it is possible to recognize that the image data of the image 341 represent a flank surface of the groove 342. Thereby, it is possible for the user or for the evaluation routine of the computer to determine a relationship or a dependence between the surface topography, which is represented by the surface model 390 and the digital image data of the image 341. The image 341 may depend more on compositional contrast than on topographical contrast. In particular, the digital image data of the image 341 may be generated depending on detector signals of the detector for back scattered electrons. Thereby, to establish a relationship or a dependency between the compositional contrast of the image data of the image 341 and the surface topography of the surface model 390.

Figure 11:
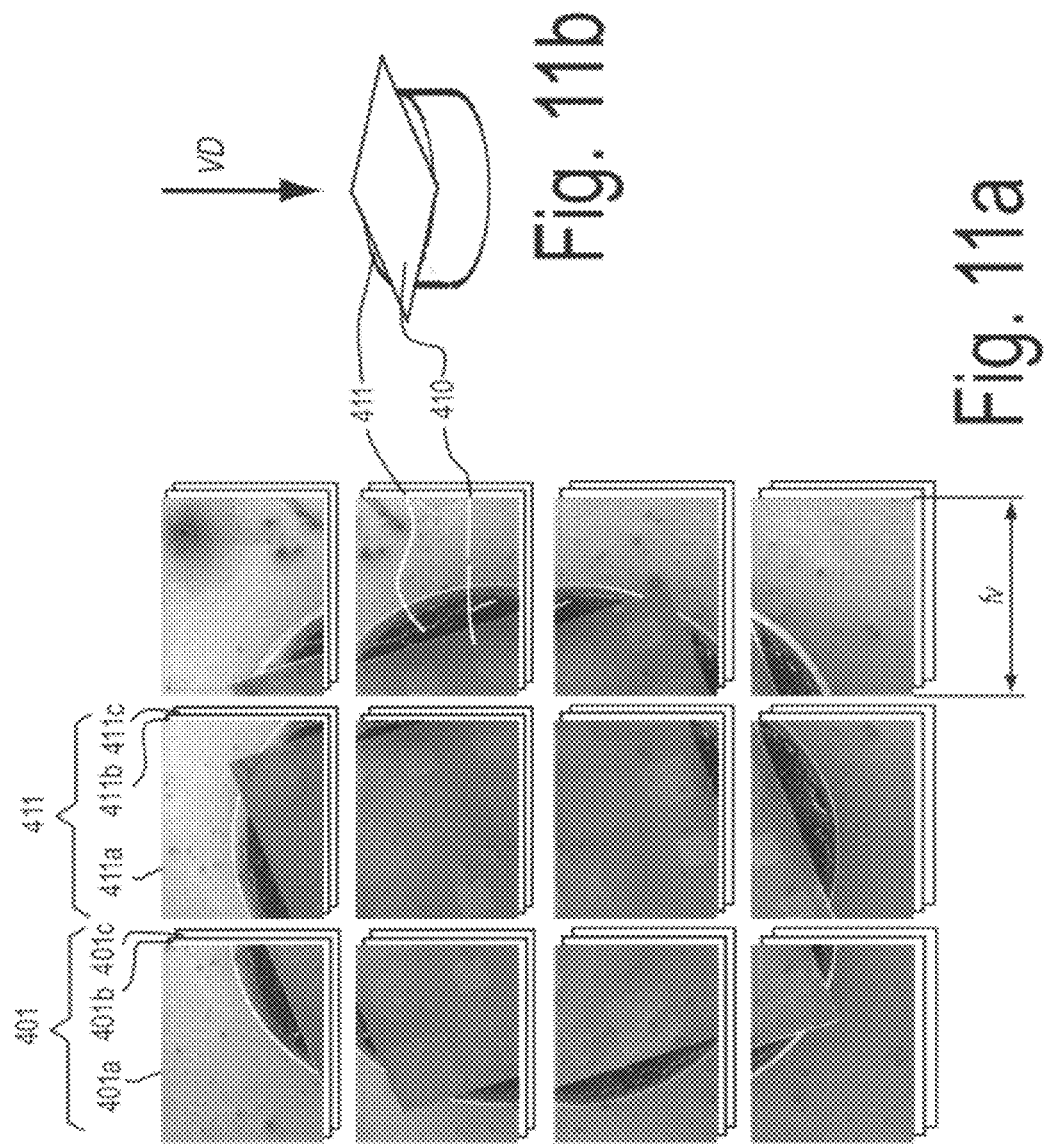
FIGS. 11a and 11b schematically show the generating of a surface model of a structure in the exemplary method as shown in FIGS. 8 and 9, wherein the structure is greater than a field of view of the particle Learn microscope.
Figure 12:
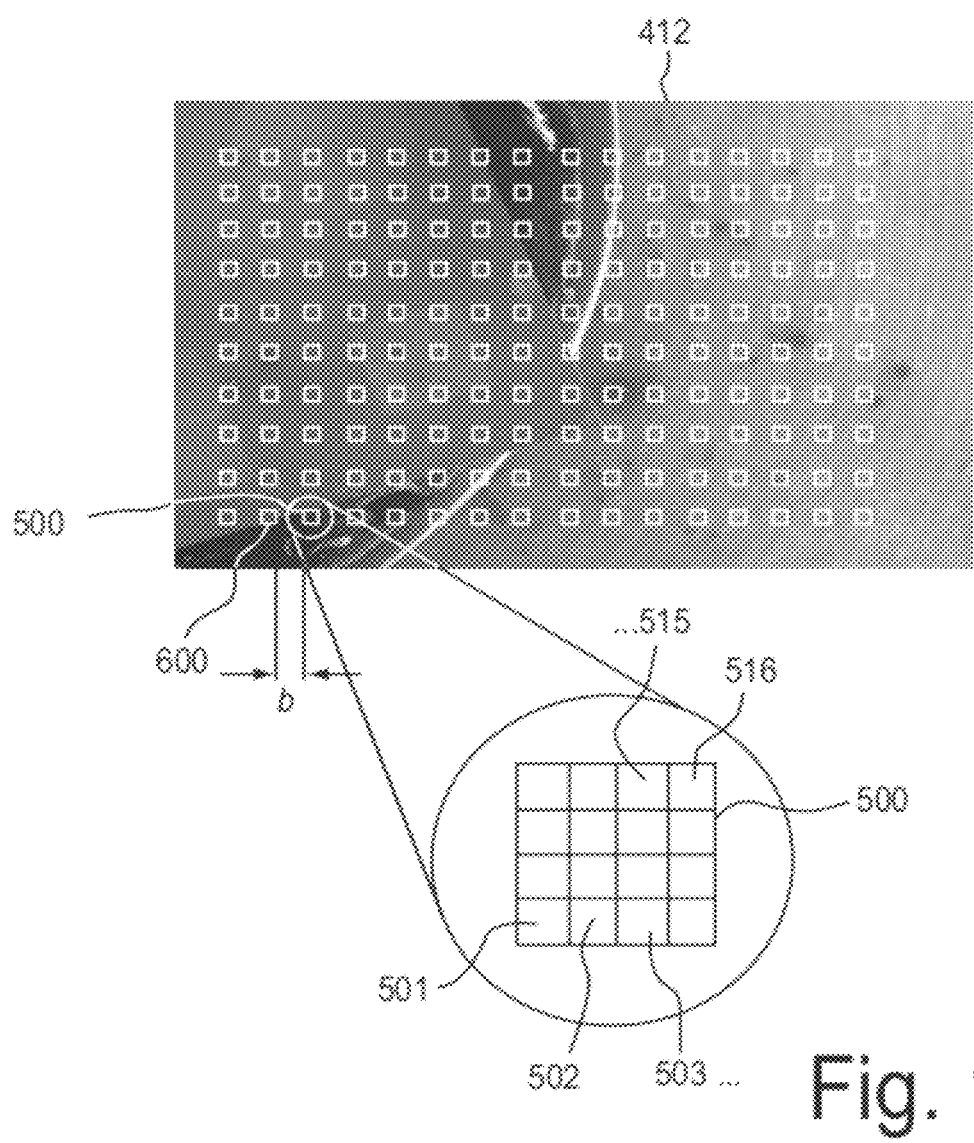
FIG. 12 schematically illustrates the generating of a surface model of a structure from particle microscopic images according to an exemplary embodiment.

FIG. 11a schematically illustrates the generating of a surface model of the structure depending on detected particles according to a further exemplary embodiment. By scanning the primary beam, a plurality of image groups is determined. In the embodiment, which is illustrated in FIG. 11a, 12 image groups have been generated. Each of the image groups comprises a plurality of digital images, which represent a same or substantially same portion of the structure. The images of the image group, are generated at mutually different focus distances. A first image group 401 comprises the digital images 401a, 401b, 401c, wherein for simplicity of illustration, only the pixel values of the image 401a are shown. Also for simplicity of illustration, only three digital images of the image group 401 are shown. Similar to the exemplary embodiment, which is shown in FIG. 9, each of the image groups may comprise a plurality of digital images, in particular more than three digital images. A second image group 411 comprises the digital images 411a, 411b and 411c. The images of all image groups represent a structure, which comprises a portion of the surface of the object holder 411 and a portion of the surface of the object 410, which are schematically illustrated in FIG. 11b. The arrow, which is shown in FIG. 11b schematically indicates an imaging direction VD of the digital images, which are shown in FIG. 11a. The imaging direction VP is oriented parallel to the optical axis of the particle optical system. Each of the digital images, which are shown in FIG. 11a, has been acquired at a working distance of the particle optical system of 20 millimeters. A side length of a field of view fv along an edge of the digital images is 5 millimeters.

With a field of view of this size, it is not possible to image the complete top surface of the object 411 in a single scanning process. However, a surface model may be generated depending on the plurality of image groups of particle optical images, as shown in FIG. 11a. Each of the image groups has been generated at a different position of the structure relative to the objective lens. Each of the image groups yield a surface model. The surface models of the image groups are combined to form the surface model of the structure.

In the exemplary embodiment, which is shown in FIG. 11a, the digital images of adjacent image groups show neighboring portions of the structure, which overlap. For example, the portion, which is shown in image 401a overlaps with the portion which is shown in image 411a.

Based on the images of each image group, image regions are generated, as has been discussed with reference to FIG. 9. Thereby, for each of the image groups, a surface model is obtained. The surface models of neighboring groups overlap. Depending on the data values of the surface model in the overlapping region, the surface models are combined to a surface model of the total structure.

Thereby, it is possible to generate a surface model of a structure by detecting particles, wherein the structure has a greater extent measured in a plane perpendicular to the optical axis than a side length vf of a field of view of an image of the particle optical system.

FIG. 12 schematically illustrates an alternative embodiment for generating a surface model depending on detected particles. A digital image 412 shows one of a plurality of images, from which image regions 600 are generated. The image regions 600 show portions of the structure, which are located at a distance spaced apart from each other. In other words, image regions are neither adjacent nor overlapping. The image regions 600 may consist of a plurality of pixels of between 1 and 8, or between 1 and 50, or between 1 and 500 or between 1 and 1,000 or between 1 and 10,000 pixels. In the exemplary embodiment, as shown in FIG. 11, the image regions 600 are pixel clusters, each of which consist of 16 pixels. For example, the first image region 500 consists of pixels 501, . . . 516.

Each of the pixel clusters is an isolated pixel cluster. In other words, each point of the structure, which is represented by the first image region, is located from each point of the structure, which is represented by a further image region, at least with a distance b. One of those further image regions is the image region 600. The distance b may be a multiple of the diameter of a portion of the structure, which is represented by a pixel of the pixel cluster. This diameter may be defined as the sampling distance. The distance b may be greater than 10 times, greater than 100 times or greater than 1,000 times the sampling distance. The distance b may be less than 10,000 times the sampling distance.

Accordingly, it is possible to calculate a surface model of the structure within a comparatively short time. In particular, it is thereby possible that only a small portion of the structure has to be scanned by the primary beam and/or only image data from a comparatively small number of pixels have to be processed for generating the surface model.

It is further conceivable, that one or more or all pixel clusters consist of a single pixel. The pixel, represents a location at which the primary beam is positioned at the structure. At this location, a focus distance of the primary beam may be varied without scanning the surface. During the varying of the focus distance, particles are detected which are generated by an interaction of the primary beam with the structure. Depending on the detector signal, it may be determined which focus distance corresponds to the object distance, i.e. when a distance between the irradiated portion of the structure and the beam waist is less than half of the depth of focus. Thereby, it is possible to generate a surface model of a structure in a very short time.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A method of operating a particle beam microscope, which comprises an objective lens having an object region, wherein the method comprises:
   detecting at least one of light rays which emanate from a structure and particles which emanate from the structure, wherein the structure comprises at least one of at least a portion of a surface of an object and at least a portion of a surface of an object holder of the particle beam microscope;
   generating a surface model of the structure depending on the at least one of the detected light rays and the detected particles;
   determining a position and an orientation of the surface model of the structure relative to the object region;
   determining a measurement location relative to the surface model of the structure; and
   positioning the object depending on the generated surface model of the structure, depending on the determined position and orientation of the surface model of the structure, and depending on the determined measurement location.

2. The method according to claim 1, further comprising:
   generating a surface model of a microscope portion of the particle beam microscope;
   combining the surface model of the structure and the surface model of the microscope portion to generate a combined surface model; and
   calculating a distance between the surface model of the structure and the surface model of the microscope portion depending on the combined surface model;
   wherein the positioning of the object comprises monitoring the distance.

3. The method according to claim 1, wherein the determining of the position and orientation of the surface model of the structure relative to the object region comprises:
   generating a digital image from at least a portion of the structure; and
   comparing the surface model of the structure with the digital image.

4. The method according to claim 1, further comprising:
   determining a second measurement location relative to the surface model of the structure and relative to the measurement location; and
   repositioning the object depending on the measurement location and the second measurement location.

5. The method according to claim 1, further comprising:
   generating a particle microscopic image, which represents at least a portion of the measurement location;
   identifying a region of the particle microscopic image; and
   adjusting at least one of a position and an orientation of the object depending on the identified region.

6. The method according to claim 1, wherein the detecting of the at least one of the light rays and the particles comprises detecting the at least one of the light rays and the particles at a plurality of different focus distances.

7. The method according to claim 1, further comprising:
   generating digital image data, which represent at least a portion of the structure depending on the at least one of the detected light rays and the detected particles;
   wherein the generating of the surface model of the structure is performed depending on the digital image data.

8. The method according to claim 7, wherein the generating of the digital image data comprises generating the digital image data from at least two different imaging directions.

9. A machine-readable medium having stored thereon a program code which, when loaded and executed in a computer system, is adapted to perform the method according to claim 1.

10. A method of operating a particle beam microscope, wherein the method comprises:
    detecting at least one of light rays, which emanate from a structure and particles, which emanate from the structure, wherein the structure comprises at least one of at least a portion of a surface of an object and at least a portion of a surface of an object holder of the particle beam microscope;
    generating a surface model of the structure depending on the at least one of the detected light rays and the detected particles;
    generating a surface model of a microscope portion of the particle beam microscope;
    combining the surface model of the structure and the surface model of the microscope portion to generate a combined surface model;
    determining a distance between the surface model of the structure and the surface model of the microscope portion depending on the combined surface model; and
    monitoring the distance during a positioning of the object.

11. The method according to claim 10, wherein the detecting of the at least one of the light rays and the particles comprises detecting the at least one of the light rays and the particles at a plurality of different focus distances.

12. The method according to claim 10, wherein the generating of the surface model of the structure further comprises:
    generating a plurality of stacks of image regions depending on the at least one of the detected light rays and the detected particles at the plurality of focus distances;
    wherein image regions, which are part of a same stack of the plurality of stacks represent a same portion of the structure;
    determining for each stack of the plurality of stacks an in-focus region depending on the image regions of the respective stack.

13. The method according to claim 12, wherein each image region of at least a portion of the generated image regions is an isolated pixel cluster.

14. The method according to claim 10, further comprising:
generating digital image data, which represent at least a portion of the structure depending on the at least one of the detected light rays and the detected particles;
wherein the generating of the surface model of the structure is performed depending on the digital image data.

15. The method according to claim 14, wherein the generating of the digital image data comprises generating the digital image data from at least two different imaging directions.

16. The method according to claim 10, wherein the detecting of the light rays comprises: detecting of a laser beam, which has been reflected at the structure.

17. The method according to claim 10, wherein the generating of the surface model of the structure comprises:
generating a first surface model of a first portion of the structure in a first position of the structure relative to at least one of a light-sensitive image acquisition device and the objective lens;
generating a second surface model of a second portion of the structure in a second position of the structure relative to the at least one of the image acquisition device and the objective lens; and
combining the first surface model and the second surface model.

18. A machine-readable medium having stored thereon a program code which, when loaded and executed in a computer system, is adapted to perform the method according to claim 10.

19. A particle beam microscope system, comprising:
an objective lens, having an object region;
an object holder which is configured such that an object is mountable on the object holder;
a positioning device, which is configured to adjust at least one of a position and an orientation of the object holder relative to the object region;
a detecting device, which is configured to detect at least one of light rays, which emanate from a structure, and particles, which emanate from the structure, wherein the structure comprises at least one of at least a portion of a surface of the object holder and at least a portion of a surface of the object;
a computer, which is configured for signal communication with the positioning device and the detecting device, wherein the computer is further configured to:
generate a surface model of the structure depending on the at least one of the detected light rays and the detected particles;
determine a position and an orientation of the surface model of the structure relative to the object region;
determine a measurement location relative to the surface model of the structure; and to
position the object depending on the determined surface model of the structure, the determined position and orientation of the surface model of the structure and the determined measurement location.

20. The particle beam microscope system according to claim 19, wherein the computer is further configured to:
generate a surface model of a microscope portion of the particle beam microscope system;
combine the surface model of the structure and the surface model of the microscope portion to generate a combined surface model;
determine a distance between the surface model of the structure and the surface model of the microscope portion depending on the combined surface model; and to
monitor the distance during a positioning of the object.

21. The particle beam microscope system according to claim 19, wherein the particle beam microscope system is configured to generate a digital image depending on the at least one of the detected light rays and the detected particles, wherein the digital image represents at least a portion of the structure; and
wherein the computer is further configured to determine the position and the orientation of the surface model of the structure relative to the object region depending on a comparison of the surface model of the structure with the digital image.

22. The particle beam microscope system according to claim 19, wherein the detecting device is configured to generate digital image data depending on the at least one of the detected light rays and the detected particles;
wherein the computer is configured to determine the surface model of the structure depending on the digital image data.

23. The particle beam microscope system according to claim 22, wherein the detecting device is further configured to generate the digital image data from at least two viewpoint positions.

24. A particle beam microscope system, comprising:
an objective lens, having an object region;
an object holder, which is configured such that an object is mountable on the object holder;
a positioning device, which is configured to adjust at least one of a position and an orientation of the object holder relative to the object region;
a detecting device, which is configured to detect at least one of light rays which emanate from a structure and particles, which emanate from the structure,
wherein the structure comprises at least one of at least a portion of a surface of the object holder and at least a portion of a surface of the object;
a computer, which is configured for signal communication with the positioning device and with the detecting device;
wherein the computer is configured to:
generate a surface model of the structure depending on the at least one of the detected light rays and the detected particles;
generate a surface model of a microscope portion of the particle beam microscope system;
combine the surface model of the structure and the surface model of the microscope portion to generate a combined surface model;
determine a distance between the surface model of the structure and the surface model of the microscope portion depending on the combined surface model; and to
monitor the distance during a positioning of the object.

25. The particle beam microscope system according to claim 24, wherein the detecting device is configured to generate digital image data depending on the at least one of the detected light rays and the detected particles;
wherein the computer is configured to determine the surface model of the structure depending on the digital image data.

26. The particle beam microscope system according to claim 25, wherein the detecting device is further configured to generate the digital image data from at least two viewpoint positions.

* * * * *

UNITED STATES PATENT AND TRADEMARK OFFICE
CERTIFICATE OF CORRECTION

PATENT NO.       : 8,487,252 B2
APPLICATION NO.  : 13/249006
DATED            : July 16, 2013
INVENTOR(S)      : Simon Diemer et al.

Page 1 of 1

It is certified that error appears in the above-identified patent and that said Letters Patent is hereby corrected as shown below:

In the Specification

Column 1, line 10, "Partikeistrahlmikroskop" should read --Partikelstrahlmikroskop--

Column 1, line 43, "COD-camera" should read --CCD-camera--

Column 3, line 52, "of object" should read --of the object--

Column 4, line 10, "that structure" should read --that the structure--

Column 4, line 37, "0 millimeter" should read --0.1 millimeter--

Column 5, line 54, "Euherian" should read --Eulerian--

Column 7, line 21, "accuracy The" should read --accuracy. The--

Column 7, line 51, "as" should read --gas--

Column 9, line 21, "IPE" should read --IRB--

Column 9, line 24, "paraliele" should read --parallele--

Column 11, line 31, "be" should read --beam--

Column 11, line 35, "lee" should read --the--

Column 11, line 56, "cart" should read --part--

Signed and Sealed this
Fifth Day of November, 2013

Teresa Stanek Rea
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,487,252 B2 | Page 1 of 1 |
| APPLICATION NO. | : 13/249006 | |
| DATED | : July 16, 2013 | |
| INVENTOR(S) | : Simon Diemer et al. | |

It is certified that error appears in the above-identified patent and that said Letters Patent is hereby corrected as shown below:

In the Specification

Column 13, line 45, "Frahkowski" should read --Frankowski--

Column 13, line 45, "Hainch" should read --Hainich--

Column 16, line 4, "article" should read --particle--

Column 16, line 56, "Learn" should read --beam--

Column 18, line 23, "ODD-camera" should read --CCD-camera--

Column 18, line 44, "COD-camera" should read --CCD-camera--

Column 19, line 2, "computer" should read --computer 70--

Column 19, line 56, "lee" should read --the--

Column 20, line 60, "snows" should read --shows--

Column 20, line 65, "an" should read --in--

Column 22, line 63, "303" should read --38--

Column 26, line 10, "VP" should read --VD--

Column 26, line 48, ", image" should read --the image--

Signed and Sealed this
Seventeenth Day of December, 2013

Margaret A. Focarino
*Commissioner for Patents of the United States Patent and Trademark Office*